US011862522B2

(12) United States Patent
Bringoltz et al.

(10) Patent No.: US 11,862,522 B2
(45) Date of Patent: Jan. 2, 2024

(54) ACCURACY IMPROVEMENTS IN OPTICAL METROLOGY

(71) Applicant: KLA-Tencor Corporation, Milpitas, CA (US)

(72) Inventors: Barak Bringoltz, Rishon Le Tzion (IL); Evgeni Gurevich, Yoqneam Ylit (IL); Ido Adam, Qiriat Ono (IL); Yoel Feler, Haifa (IL); Dror Alumot, Rehovot (IL); Yuval Lamhot, Haifa (IL); Noga Sella, Migdal Haemek (IL); Yaron De Leeuw, Yehud (IL); Tal Yaziv, Kiryat Haim (IL); Eltsafon Ashwal-Island, Haifa (IL); Lilach Saltoun, Qiriat Ono (IL); Tom Leviant, Yoqneam Illit (IL)

(*) Notice: Subject to any disclaimer, the term of this patent is extended or adjusted under 35 U.S.C. 154(b) by 60 days.

(21) Appl. No.: 17/179,379

(22) Filed: Feb. 18, 2021

(65) Prior Publication Data
US 2021/0175132 A1    Jun. 10, 2021

Related U.S. Application Data

(63) Continuation of application No. 15/540,409, filed as application No. PCT/US2017/019077 on Feb. 23, 2017, now abandoned.
(Continued)

(51) Int. Cl.
*H01L 21/66*    (2006.01)
*G03F 7/00*    (2006.01)
*G03F 9/00*    (2006.01)

(52) U.S. Cl.
CPC .......... *H01L 22/20* (2013.01); *G03F 7/70633* (2013.01); *G03F 9/7003* (2013.01); *H01L 22/12* (2013.01)

(58) Field of Classification Search
CPC ......... H01L 22/20; H01L 22/12; H01L 22/24; H01L 22/26; H01L 22/34; G03F 7/70633;
(Continued)

(56) References Cited

U.S. PATENT DOCUMENTS 7,937,167 B1    5/2011    Mesarina et al.
2007/0009814 A1    1/2007    Oesterholt
(Continued)

FOREIGN PATENT DOCUMENTS

CN    101460884 A    6/2009
CN    103026204 A    4/2013
(Continued)

OTHER PUBLICATIONS

JPO, Office Action for JP Application No. 2018544505, dated Mar. 3, 2021.
(Continued)

*Primary Examiner* — Roy M Punnoose
(74) *Attorney, Agent, or Firm* — Hodgson Russ LLP

(57) ABSTRACT

Methods, metrology modules and target designs are provided, which improve the accuracy of metrology measurements. Methods provide flexible handling of multiple measurement recipes and setups and enable relating them to landscape features that indicate their relation to resonance regions and to flat regions. Clustering of recipes, self-consistency tests, common processing of aggregated measurements, noise reduction, cluster analysis, detailed analysis of the landscape and targets with skewed cells are employed separately or in combination to provide cumulative improvements of measurement accuracy.

9 Claims, 9 Drawing Sheets

Related U.S. Application Data

(60) Provisional application No. 62/299,535, filed on Feb. 24, 2016.

(58) Field of Classification Search
 CPC ... G03F 9/7003; G03F 7/70616; G06F 16/285
 See application file for complete search history.

(56) References Cited

U.S. PATENT DOCUMENTS

| | | |
|---|---|---|
| 2009/0262362 A1 | 10/2009 | de Groot et al. |
| 2011/0015773 A1 | 1/2011 | Wilby |
| 2014/0257734 A1 | 9/2014 | Bringoltz et al. |
| 2014/0340682 A1 | 11/2014 | Kwak et al. |
| 2015/0204664 A1 | 7/2015 | Bringoltz et al. |
| 2018/0047646 A1* | 2/2018 | Bringoltz .............. G06F 16/285 |

FOREIGN PATENT DOCUMENTS

| | | |
|---|---|---|
| CN | 104736962 A | 6/2015 |
| JP | 2007309679 A | 11/2007 |
| JP | 2010091361 A | 4/2010 |
| JP | 2013534368 A | 9/2013 |
| JP | 2014527633 A | 10/2014 |
| JP | 2015524555 A | 8/2015 |
| JP | 2015210140 A | 11/2015 |
| JP | 2015534267 A | 11/2015 |
| WO | 2014062972 A1 | 4/2014 |
| WO | 2016086056 A1 | 6/2016 |

OTHER PUBLICATIONS

JPO, Office Action for JP Application No. 2021-186155, dated Jan. 10, 2023.
CNIPA, Chinese Office Action for CN Application No. 201780012673.0, dated Dec. 5, 2022.

* cited by examiner

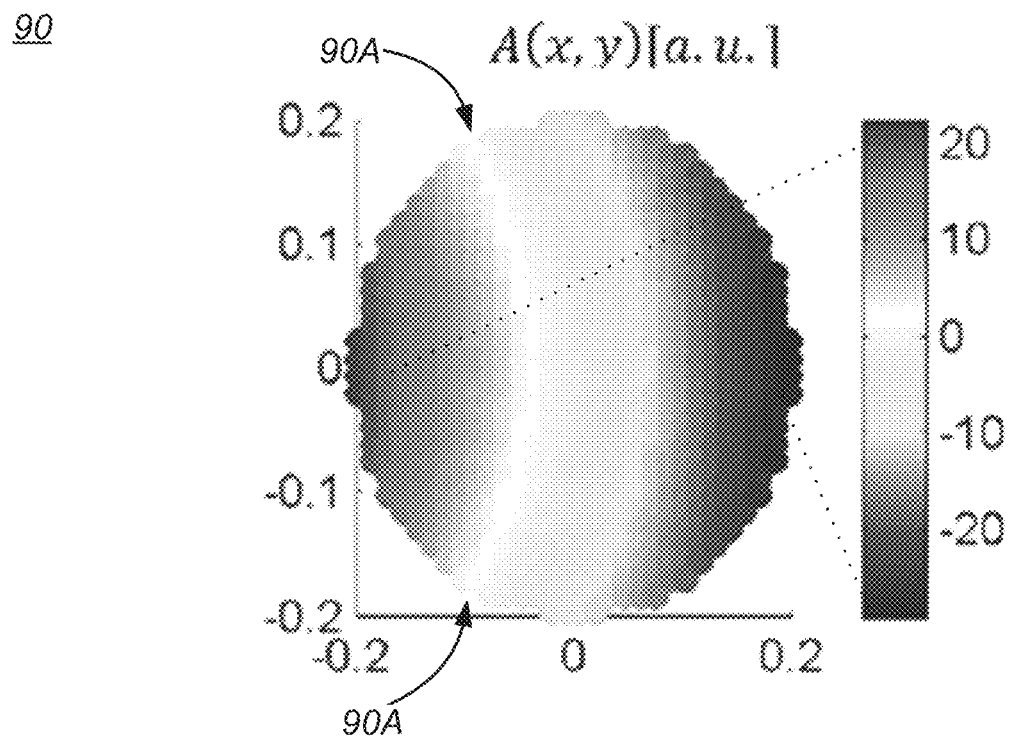
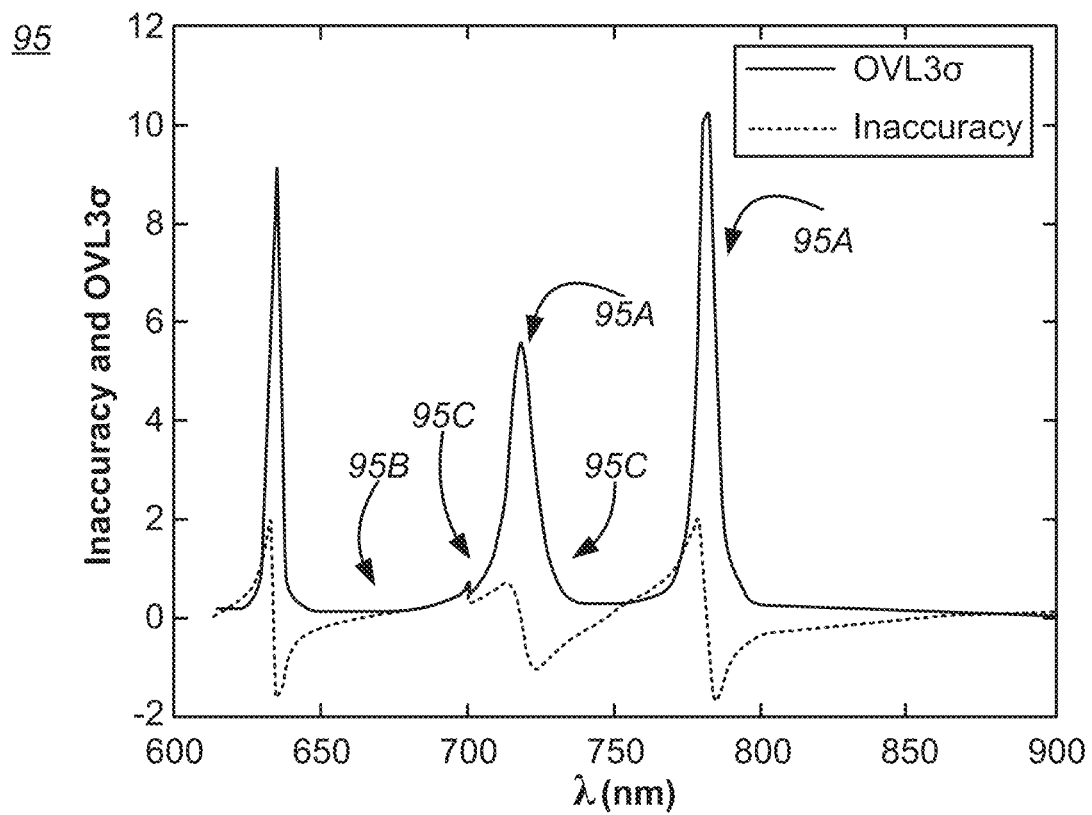
Figure 1 - Prior art

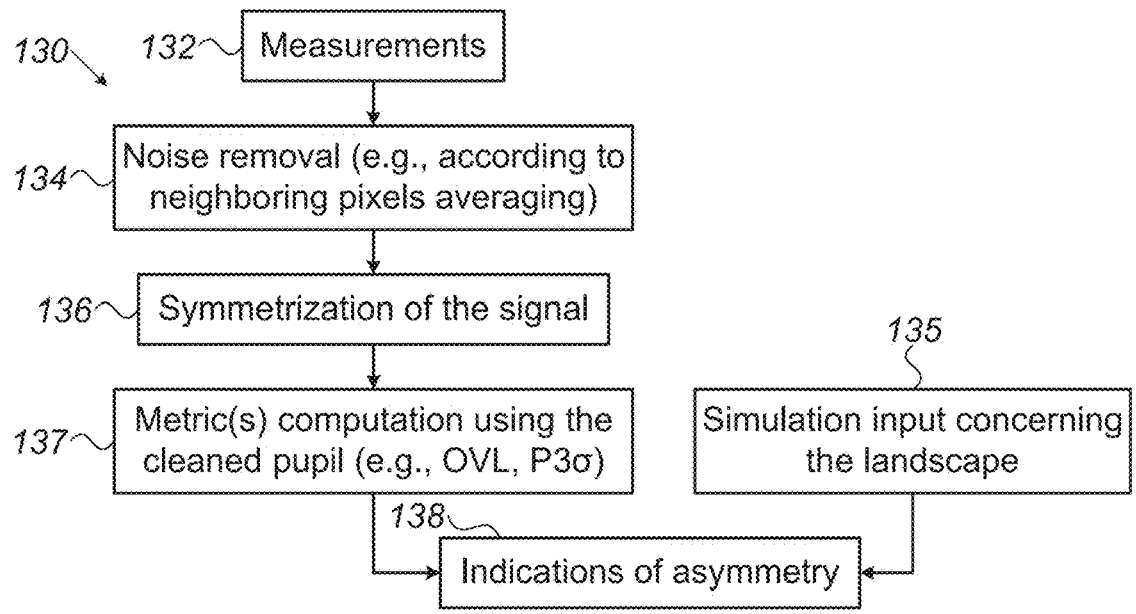
Figure 4
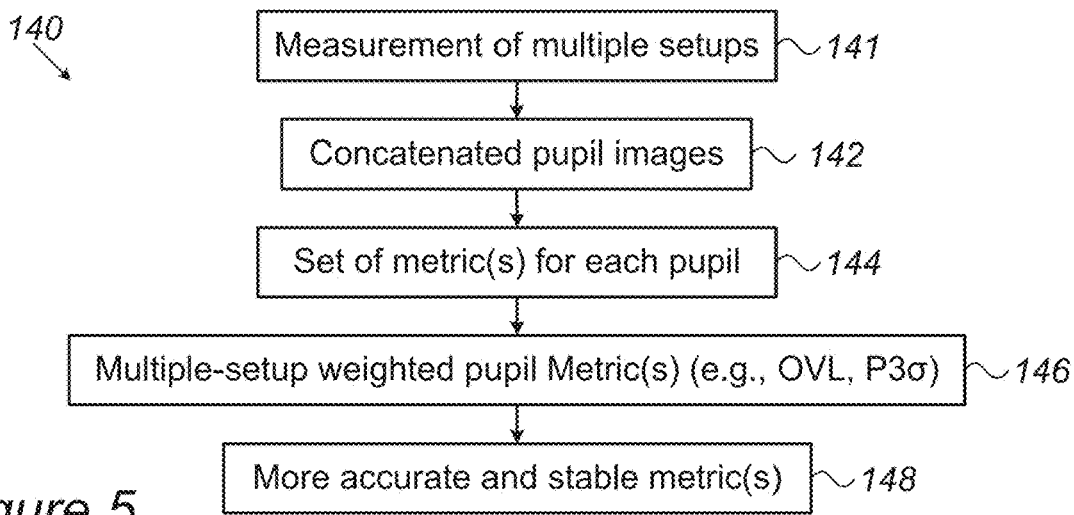
Figure 5
Figure 6
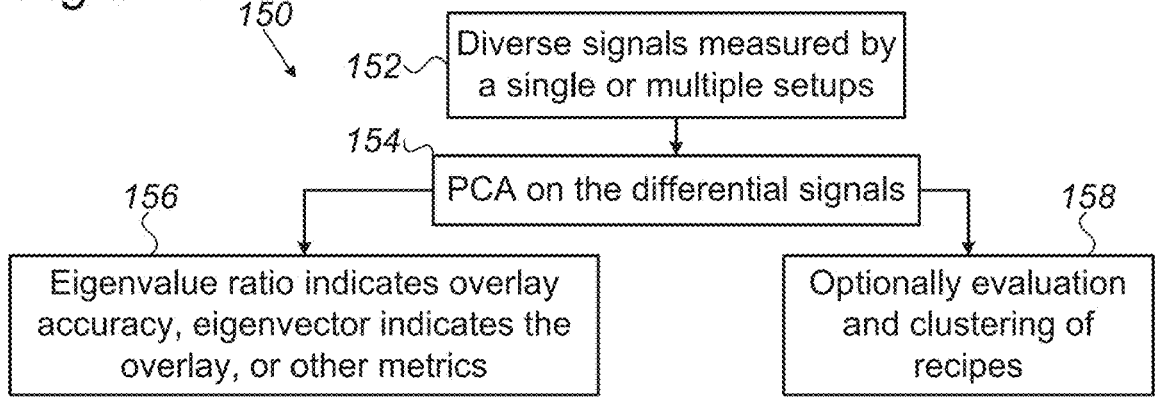

ACCURACY IMPROVEMENTS IN OPTICAL METROLOGY

CROSS REFERENCE TO RELATED APPLICATIONS

This application is a continuation of U.S. patent application Ser. No. 15/540,409 filed on Jun. 28, 2017, which is a national stage entry of PCT/US2017/019077 filed Feb. 23, 2017, which claims the benefit of U.S. Provisional Patent Application No. 62/299,535 filed on Feb. 24, 2016, the disclosures of which are hereby incorporated by reference.

BACKGROUND OF THE INVENTION

1. Technical Field

The present invention relates to the field of metrology, and more particularly, to techniques that achieve better accuracy in optical metrology.

2. Discussion of Related Art

Various optical metrology technologies require that the process variations which cause asymmetry in the metrology signal be much smaller than some threshold, so that the part of the asymmetry signal is much smaller than the signal asymmetry caused by the overlay. In reality, however, such process variations may be quite large (especially in the research and development phase of chip development) and they may induce sizeable errors in the overlay reported by the metrology; errors that may reach the nanometer regime, thereby consuming a significant part of the overlay metrology budget.

Current solution methodologies involve performing recipe and target design optimizations that optimize the overlay induced asymmetry in the signal and minimize the asymmetries caused by other process variations. The optimization metric may be derived from the metrology signal (for example, from the experimentally estimated overlay sensitivity) or it may rely on external metrologies for calibration. However, prior art methodologies do not estimate reliably the inaccuracy of the metrology in train and cannot do so at all in run time using traditional recipe optimization (e.g., using CDSEM—critical dimensions scanning electron microscopy to calibrate the measurement); and the presence of process variations that are symmetric (for example, a change in a certain layer's thickness of an overlay mark), may make the recipe optimization obsolete since different recipes may perform differently during research and development, in train and in runtime. Such a problem may also take place across the wafer, as different recipes may perform differently over different regions of the wafer.

WIPO Publication No. 2016086056, which is incorporated herein by reference in its entirety, discloses methods of deriving a partially continuous dependency of metrology metric(s) on recipe parameter(s), analyzing the derived dependency, determining a metrology recipe according to the analysis, and conducting metrology measurement(s) according to the determined recipe. The dependency may be analyzed in form of a landscape such as a sensitivity landscape in which regions of low sensitivity and/or points or contours of low or zero inaccuracy are detected, analytically, numerically or experimentally, and used to configure parameters of measurement, hardware and targets to achieve high measurement accuracy. Process variation is analyzed in terms of its effects on the sensitivity landscape, and these effects are used to characterize the process variation further, to optimize the measurements and make the metrology both more robust to inaccuracy sources and more flexible with respect to different targets on the wafer and available measurement conditions.

SUMMARY OF THE INVENTION

The following is a simplified summary providing an initial understanding of the invention. The summary does not necessarily identify key elements nor limits the scope of the invention, but merely serves as an introduction to the following description.

Some aspects of the present invention provide a method comprising identifying measurement setups which correspond to each other in measurement values of at least one metric by applying a self-consistency test to the measurement values, to yield a plurality of clusters of setups, determining a most reliable cluster according to statistical characteristics of the clusters, and deriving a measurement result from at least one setup in the determined most reliable cluster.

Some aspects of the present invention provide a method comprising selecting a plurality of measurement setups for a corresponding plurality of wafer regions, wherein the wafer regions are pre-determined or determined on-the-fly and wherein the measurement setups are selected according to at least one accuracy metric, and carrying out metrology measurements with the selected measurement setup for each corresponding wafer region.

Some aspects of the present invention provide a method comprising modifying a pixel value in a metrology pupil image according to an average of neighboring pixel values to reduce random noise in the pupil image.

Some aspects of the present invention provide a method comprising deriving a value of a metrology metric from multiple measurements of the metric using different measurement setups and/or different targets, wherein the value is derived from a concatenation of pixels from the multiple measurements.

Some aspects of the present invention provide a method comprising deriving a measurement setup by applying a Principal component analysis (PCA) to a plurality of metrology measurements from using a plurality of setups, and selecting a measurement setup which exhibits a smallest ratio of small to large eigenvalues from the PCA.

Some aspects of the present invention provide a method comprising indicating inaccuracy in metrology measurements by calculating a difference between at least two values of at least one metrology metric, the at least two values derived from at least two metrology algorithms, and setting a threshold for the calculated difference.

Some aspects of the present invention provide a method comprising indicating a proximate region in a landscape which is proximate to a resonance region, wherein the landscape comprises an at least partially continuous dependency of at least one metrology metric on at least one parameter and the resonance region in the landscape corresponds to a resonance of optical illumination in a measured location, the indicating being carried out by calculating a variability of pupil signal or at least one function thereof, and comparing the calculated variability with a predefined threshold, wherein surpassing the predefined threshold indicates the proximate region.

Some aspects of the present invention provide a method comprising determining resonant regions in a landscape, wherein the landscape comprises an at least partially continuous dependency of at least one metrology metric on at least one parameter and the resonance region in the landscape corresponds to a resonance of optical illumination in a measured location, the determining being carried out by detecting non-analytic behavior of at least one metrology metric comprising: spanning a space of the analytic functions over pupil coordinates by a basis of analytic functions, expressing the metrology metric in terms of the basis of analytic functions and estimating a residual of the expressing, wherein a residual larger than a predetermined threshold indicates the non-analytic behavior.

Some aspects of the present invention provide a metrology target comprising a plurality of target cells having periodic structures along at least two different and non-perpendicular measurement directions.

Some aspects of the present invention provide combinations of methods which provide cumulative improvements of measurement accuracy.

These, additional, and/or other aspects and/or advantages of the present invention are set forth in the detailed description which follows; possibly inferable from the detailed description; and/or learnable by practice of the present invention.

BRIEF DESCRIPTION OF THE DRAWINGS

For a better understanding of embodiments of the invention and to show how the same may be carried into effect, reference will now be made, purely by way of example, to the accompanying drawings in which like numerals designate corresponding elements or sections throughout.

In the accompanying drawings:

FIG. 1 is a high level schematic block diagram of a pupil image and a landscape, according to the prior art.

FIG. 4 is a high level schematic flowchart of a method of noise removal and smoothing of the pupil images, according to some embodiments of the invention.

FIG. 5 is a high level schematic flowchart of a method of improving the metrics over the pupil images, according to some embodiments of the invention.

FIG. 6 is a high level schematic flowchart of a method of analyzing variation among recipes, according to some embodiments of the invention.

DETAILED DESCRIPTION OF THE INVENTION

Figure 2:
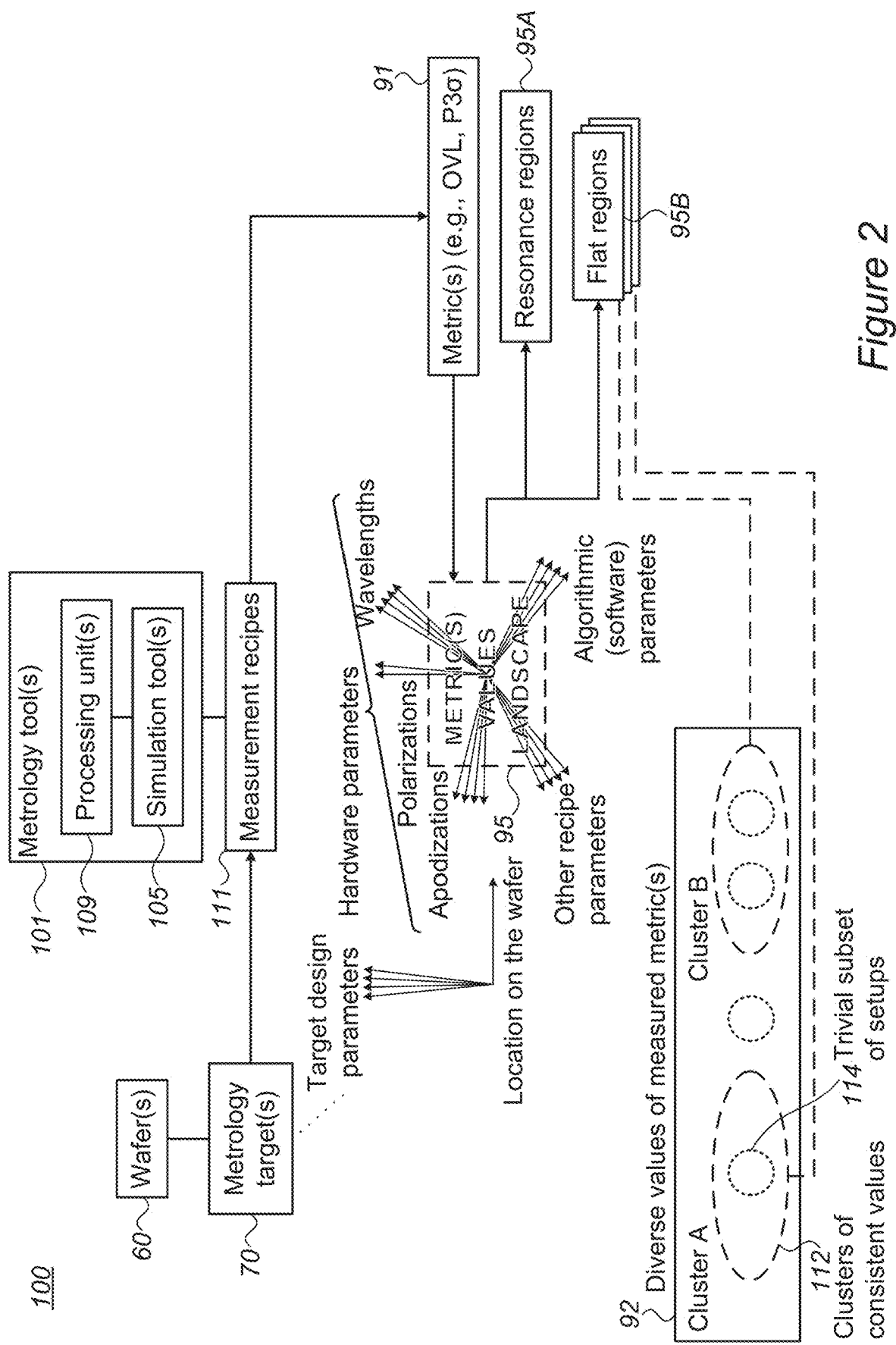
FIG. 2 is a high level schematic illustration of a method of measuring self-consistency and diversity among recipes and clustering the measurements accordingly, according to some embodiments of the invention.

In the following description, various aspects of the present invention are described. For purposes of explanation, specific configurations and details are set forth in order to provide a thorough understanding of the present invention. However, it will also be apparent to one skilled in the art that the present invention may be practiced without the specific details presented herein. Furthermore, well known features may have been omitted or simplified in order not to obscure the present invention. With specific reference to the drawings, it is stressed that the particulars shown are by way of example and for purposes of illustrative discussion of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice.

Before at least one embodiment of the invention is explained in detail, it is to be understood that the invention is not limited in its application to the details of construction and the arrangement of the components set forth in the following description or illustrated in the drawings. The invention is applicable to other embodiments that may be practiced or carried out in various ways as well as to combinations of the disclosed embodiments. Also, it is to be understood that the phraseology and terminology employed herein is for the purpose of description and should not be regarded as limiting.

Unless specifically stated otherwise, as apparent from the following discussions, it is appreciated that throughout the specification discussions utilizing terms such as "processing", "computing", "calculating", "determining", "enhancing" or the like, refer to the action and/or processes of a computer or computing system, or similar electronic computing device, that manipulates and/or transforms data represented as physical, such as electronic, quantities within the computing system's registers and/or memories into other data similarly represented as physical quantities within the computing system's memories, registers or other such information storage, transmission or display devices.

Embodiments of the present invention provide efficient and economical methods and mechanisms for improving accuracy, particularly in overlay optical metrology and provide improvements to the technology field. Novel methods are disclosed to achieve superior accuracy in optical metrology that are aimed to deliver very small inaccuracies in run time and/or train. Methods, metrology modules and target designs are provided, which improve the accuracy of metrology measurements. Methods provide flexible handling of multiple measurement recipes and setups and enable relating them to landscape features that indicate their relation to resonance regions and to flat regions. Clustering of recipes, self-consistency tests, common processing of aggregated measurements, noise reduction, cluster analysis, detailed analysis of the landscape and targets with skewed cells are employed separately or in combination to provide cumulative improvements of measurement accuracy.

Landscapes

Optical overlay metrology is a metrology of the asymmetry carried by the metrology signal that is due to the overlay between two lithography steps. This asymmetry is present in the electromagnetic signal because the latter reflects the interference of electric fields with relative phases that carry the overlay information. Specifically, (i) in overlay scatterometry (be it pupil scatterometry of field scatterometry) the overlay mark (target) is a grating-over-grating structure and the overlay information is carried in the relative phase of the lower and upper gratings; (ii) in overlay scatterometry of the side-by-side type (see, e.g., WIPO Publication No. 2014062972) the overlay mark (target) comprises a grating next to a grating structure and the overlay information is again carried in the relative phase of the lower and upper gratings; (iii) in overlay imaging the overlay mark (target) comprises separate marks for the separate layers and the overlay information is carried in the position of each individual mark on the detector which, in turns, is a result of interferences between different diffraction orders of the individual marks.

As a result, the sensitivity of the signal (i.e., the extent by which the signal asymmetry is affected by the sought for overlay) is primarily affected by the change in the size of the interference term in these signals. For example, in grating-over-grating and side-by-side targets, some of the terms in the interference phase depend on the optical path difference between light scattered from the lower and upper gratings, which is linear in the thickness of the film stack separating them and inversely proportional on the wavelength. It also depends on other parameters like the angle of incidence, or reflectance, and on the polarization properties of the incident and reflected light. Other properties include the target attributes and the stack and gratings electromagnetic characteristics. In contrast, in overlay imaging, the interference phase is also be linear in the tool's focus and to depend on other parameters such as the incident angles.

Observing how the sensitivity of the metrology tool depends on the tool parameters in a continuous fashion, and in particular on various differentials of many of the metrology characteristics (such as the first, second, and higher derivatives of the sensitivity on wavelength, focus, polarization, etc.) reveals the landscape of the technology performance, as explained below. This landscape is particular to any nominal stack, and the inventors have discovered, using simulations and theory, that this landscape is universal in the sense that is largely independent of many type of process variations including all those that break the symmetry of the overlay mark and cause inaccuracy. Tool performances of course include also the inaccuracy which, by definition, strongly depends on the asymmetric process variations, however, the landscape that determines at which sub-sections of the landscape the sensitivity to these process variations is the strongest and in which sub-sections it is the weakest, and how the sensitivity looks like. Specifically, and to a large degree, the same regions that are sensitive to process variation of a certain type are always sensitive to all other types of process variations as this is determined by the nominal stack's sensitivity to overlay, i.e., the sensitivity of a stack with no asymmetric process variations).

FIG. 1 is a high level schematic block diagram of a pupil image 90 and a landscape 95, according to the prior art. Landscape 95 exhibits pupil locations 90A having zero sensitivity (in form of an arc across the pupil image), resonance regions 95A, flat regions 95B and intermediate regions 95C which are analyzed and handled by various embodiments of the invention, e.g., to enhance the accuracy of the metrology measurements, as explained below.

WIPO Publication No. 2016086056 discloses the concept of the landscape in metrology measurements, which is a dependency of one or more metrology metric(s), e.g., scatterometry overlay (SCOL) metrics, on one or more parameter. As a non-limiting example, the landscape may express the dependency of any of the overlay, the variation of the overlay (e.g., the Pupil3S metric) and/or the inaccuracy (estimated overlay minus real overlay) upon one or more process parameters, measurement parameters and target parameters. In particular, as described in WIPO Publication No. 2016086056, the inventors have found out that certain regions in the landscape exhibit steep changes that are related to resonances in the optical system (e.g., resonance of illumination within the wafer layers and/or between target structures), which may be used to provide more information on the measured region.

The following provides various techniques to use the perspective of the landscape on overlay accuracy, and the way it is reflected by various properties of the signal (for example in the way it depends on the pupil coordinates in pupil scatterometry), to improve overlay accuracy. Any of the disclosed methods and tools may be combined in actual metrology methods and tools to add up the benefits provided by different embodiments and aspects of the disclosed invention.

Clustering of Measurements and Recipes

FIG. 2 is a high level schematic illustration of a method 100 of measuring self-consistency and diversity among recipes 111 and clustering the measurements accordingly, according to some embodiments of the invention. Metrology tools 101 are configured to apply measurement recipe(s) 111 to derive metrology measurements of metrology targets 70 on wafer(s) 60. Metrology tools 101 typically utilize processing unit(s) 109 and possibly simulation tool(s) 105 in determining in adjusting measurements recipes 111. Measurements recipes 111 (also termed setups in the following) derive values of metrology metric(s) 91 form the measurement, and may be used to derive landscape(s) 95 of the measured values, as explained above and in WIPO Publication No. 2016086056. Landscape(s) 95 express the dependency of metrology metric(s) 91 on parameters such as: hardware parameters (e.g., focus, spot position, illumination wavelengths and polarization, optical elements such as apodizers and various other parameters relating to hardware aspects of the measurements), algorithmic parameters (e.g., various software parameters such as per-pixel weight or algorithmic thresholds, types of algorithms, applied processing steps) and other recipe parameters, as well as target design parameters and target location on the wafer—all of which are indicated in FIG. 2 schematically by arrows that represent possible axes of landscape(s) 95. Resonance regions 95A and flat regions 95B may be identified in landscape(s) 95, as explained in WIPO Publication No. 2016086056.

The inventors have found out that accuracy may be improved by determining the most accurate measuring method out of many possible options with the use of self-consistency as an indicator for accuracy. Assuming that when measuring a physical quantity of interest (for example, the CD (critical dimension) value of a bar in target 70 in a certain wafer position, or the overlay in a certain alignment scheme at a certain wafer position) by a set of measurements that are all expected to be accurate and precise (for example, all the measurements having good TMU (total measurement uncertainty) and good pupil-derived metrics of a certain type and\or all the measurements having good image or signal quality according to specified criteria in optical, SEM (scanning electron microscopy), TEM (transmission electron microscopy) and/or AFM (atomic force microscopy) image or signals)—then a quantitative agreement between these measurements should take place. This can be considered a test to the accuracy of the measurements termed a self-consistency test, which may provide a basis for an algorithm that finds and fuses different measurements together into an accurate one, as disclosed below.

For example, in overlay metrology, data shows that when many setups from different and diverse flat regions 95B in landscape 95 agree on their overlay value, they are also most likely to be accurate. This agreement may be used to distinguish between setup measurements from flat regions 95B and other measurement which have good or moderate pupil-derived metrics, but that do not agree with any or few of the other setups or recipes 111. These considerations may be applied to various metrology metric 91, e.g., to CD measurements as well. In practice, the inventors have found that the disclosed test of self-consistency often reveals in data and\or simulations groups of setups that show an agreement on the measurement value within a group but that may disagree between each other. These groups of setups are denoted as clusters 112 (e.g., clusters A, B, etc.) within a space 92 of diverse values of measured metrics 91 and are shown schematically in FIG. 2.

Finding the accurate group (cluster 112) with correspond to the accurate setups may be carried out by calculating the number of different flat regions 95B the group members belong to, and the diversity of each group's member list, as well as other metrics such as the maximal difference of the measurement value within each group.

The self-consistency test may be performed by finding the groups (clusters 112) of setups and applying an algorithm to determine the diversity of the groups (clusters 112). The diversity in each cluster 112 may be quantified in different ways, e.g., as the number of setups in a group that represent different flat regions 95B. The diversity of clusters 112 may be used to estimate the likelihood of a group to be accurate (its likelihood increases if, despite its diversity, its size is tight and the setups disagreement is small) as well as to separate, algorithmically, trivial agreement among setups resulting from factors such as a simple repetition of the measurement and\or a situations where setups agree only because they come from very close points in landscape 95, denoted schematically in FIG. 2 as a trivial subset of setups 114. Finally, the groups (clusters 112) and measurements within the groups may be ranked to provide a recommendation of the best measuring conditions.

In certain embodiments, measurements 92 may be formalized by describing each measurement setup 111 as an n dimensional vector, with n being the number of independent realizations of such a measurement, for example, the number of wafer positions on which the measurement takes place). A dimensionally reduced quantity, e.g. a scalar distance, may be defined between pairs of measurements. The distance may be defined from raw data or from model terms. For example, a threshold of maximal distance within groups may be used to give a graph representation of the connections. A m by m adjacency matrix $$\begin{pmatrix} x_{1,1} & \cdots & x_{1,m} \\ \vdots & \ddots & \vdots \\ x_{m,1} & \cdots & x_{m,m} \end{pmatrix}$$

may be constructed, with m being the number of measurements setups, with elements $x_{i,j}$ being equal to one if the distance between two measurements i, j is below the threshold and zero above or by weighting the connection according to the dimensionally reduced quantity. Using the adjacency matrix the measurements may be clustered by means of machine learning and/or graph theory algorithms. A more generalized version of this option is to adaptively find the typical size of cluster 112 by analyzing the spectral function of the way the amount and size distribution of clusters 112 behave as a function of the cluster thresholds and searching for plateaus.

Each cluster 112 may be composed of many measurements, which, however, may not necessarily be independent from each other, as some layers are less sensitive to machine setup or target designs, in which the measurement may differ from each other. Counting the number of measurements in each cluster 112 may be modified to take into account only independent measurements. In order to determine the independence of two measurements the correlation between them may be calculated, e.g., using metrics that are not used for the clustering itself, such as signal-derived metrics. The correlation may be calculated on the n-dimensional space mentioned above, to determine independent measurements. In order for two recipes 111 within one cluster 112 to be independent, they must agree within a bound on the measurement value across the wafer and disagree across wafer in their signal metrics.

Alternatively or complementarily, the clustering may be carried out by employing clustering analysis techniques from the world of data mining. A number of clustering methods can be used. Cliques give groups that are not sampling dependent but give overlapping clusters. Hierarchical clustering give separate clusters, no measurement can appear in two clusters but can yield different results when omitting measurements. K means has no overlap but needs a defined number of clusters. A combination of methods can be used to find the clusters.

After clustering is carried out, metrics that are cluster-specific, e.g., diversity or diameter, may be calculated, along with finding representative recipes for clusters 112. These metrics may be further used to rank clusters 112 and recipes 111 within and between clusters 112. Both signal-derived metrics per recipe (like those derived from the pupil in the case of pupil scatterometry, or from the harmonic space in the case of imaging based overlay) and data arriving from the other recipes in the same cluster may be used to grade each recipe and rank it to provide a set of recommended recipes. Corresponding self-consistent measures may be derived from the disclosed deriving and processing of clusters 112.

Figure 11:
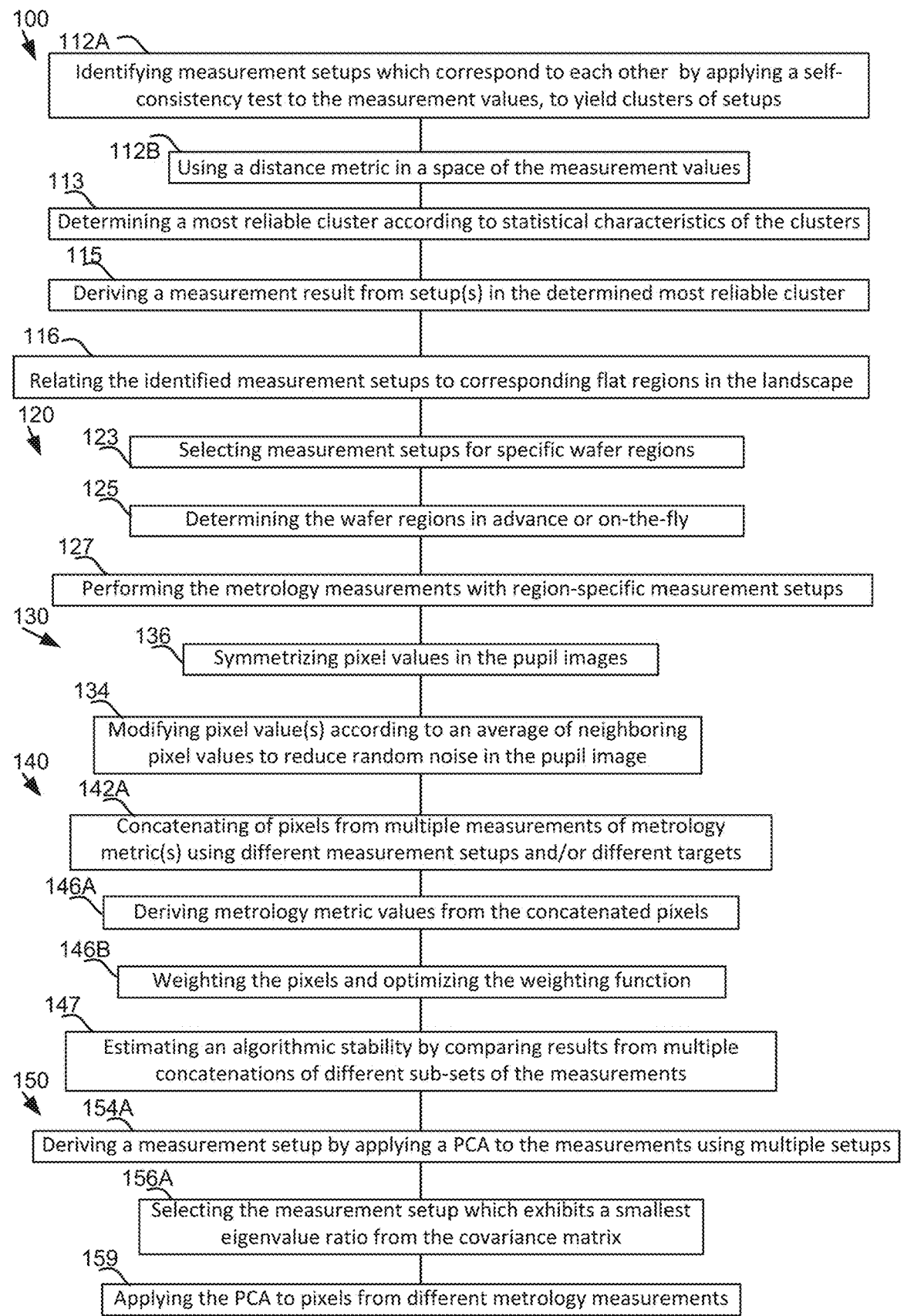
FIG. 11 is a high level schematic flowchart illustrating a list of steps of methods disclosed herein, according to some embodiments of the invention.
Figure 11:
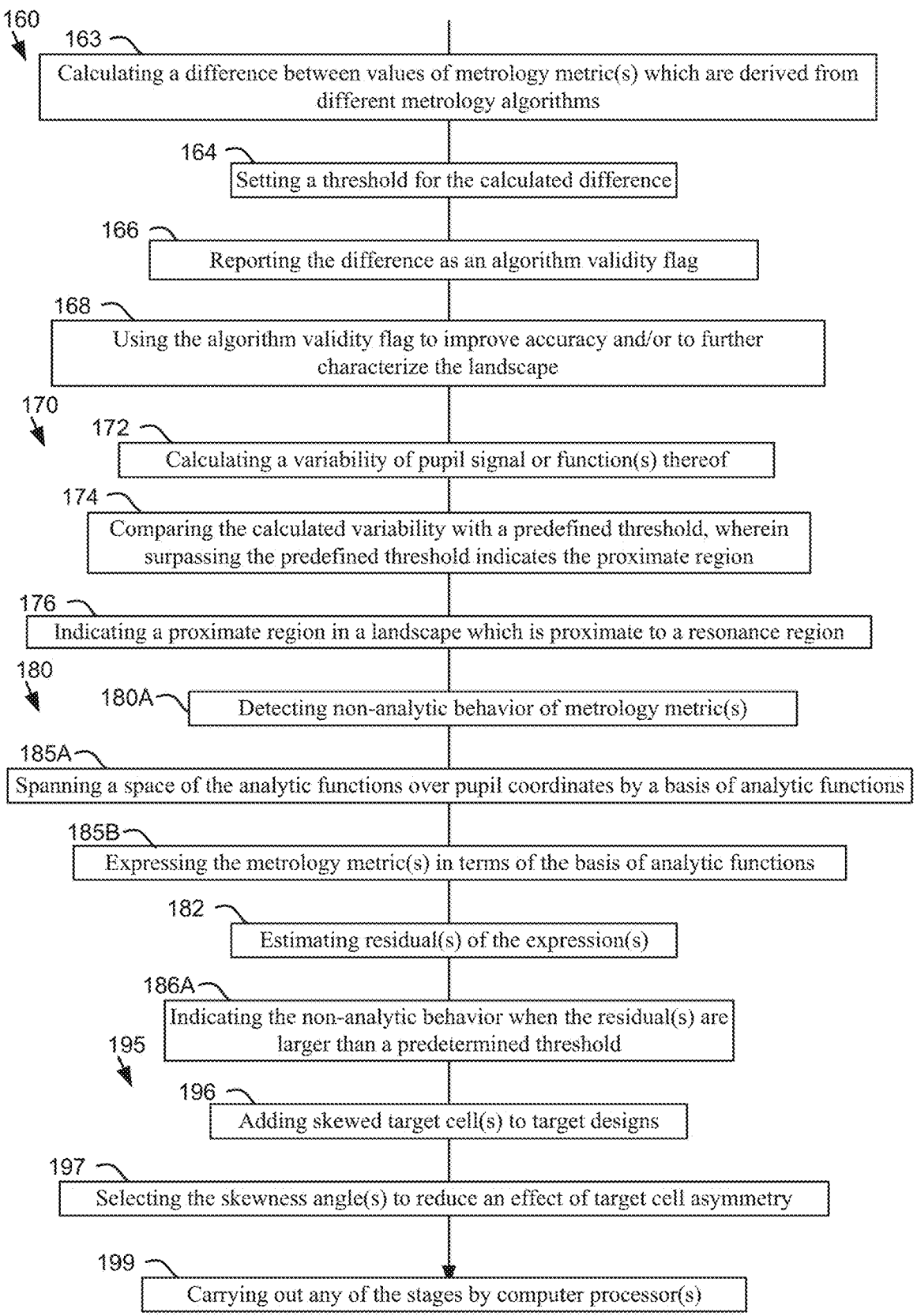

FIG. 11 is a high level schematic flowchart illustrating a list of steps of methods disclosed herein, according to some embodiments of the invention. FIG. 11 comprises multiple methods disclosed herein, which may be carried out separately or in combination. Any of the stages of any one of the methods may be carried out by at least one computer processor (stage 199).

Method 100 of clustering of setups with relation to different flat regions in the landscape may comprise measuring self-consistency and diversity among recipes 111 and clustering the measurements accordingly. Certain embodiments comprise a computer program product comprising a non-transitory computer readable storage medium having computer readable program embodied therewith, the computer readable program configured to carry out any of the stages of method 100; and possibly a metrology module configured to carry out any of the stages of method 100. Any of the relevant stages of method 100 may be carried out by a computer processor, e.g., in processing unit(s) 109.

Method 100 may comprise identifying measurement setups which correspond to each other in measurement values of at least one metric by applying a self-consistency test to the measurement values, to yield a plurality of clusters of setups (stage 112A), wherein the identifying may be carried out using a distance metric in a space of the measurement values (stage 112B). Method 100 further comprises determining a most reliable cluster according to statistical characteristics of the clusters (stage 113) and deriving a measurement result from at least one setup in the determined most reliable cluster (stage 115). The statistical characteristics may comprise at least a size and a diversity of each cluster. Method 100 may further comprise relating the identified measurement setups to corresponding at least one flat region in a measurement landscape that comprises an at least partially continuous dependency of at least one metrology metric on at least one parameter (stage 116).

Clustering of Wafer Regions

Figure 3:
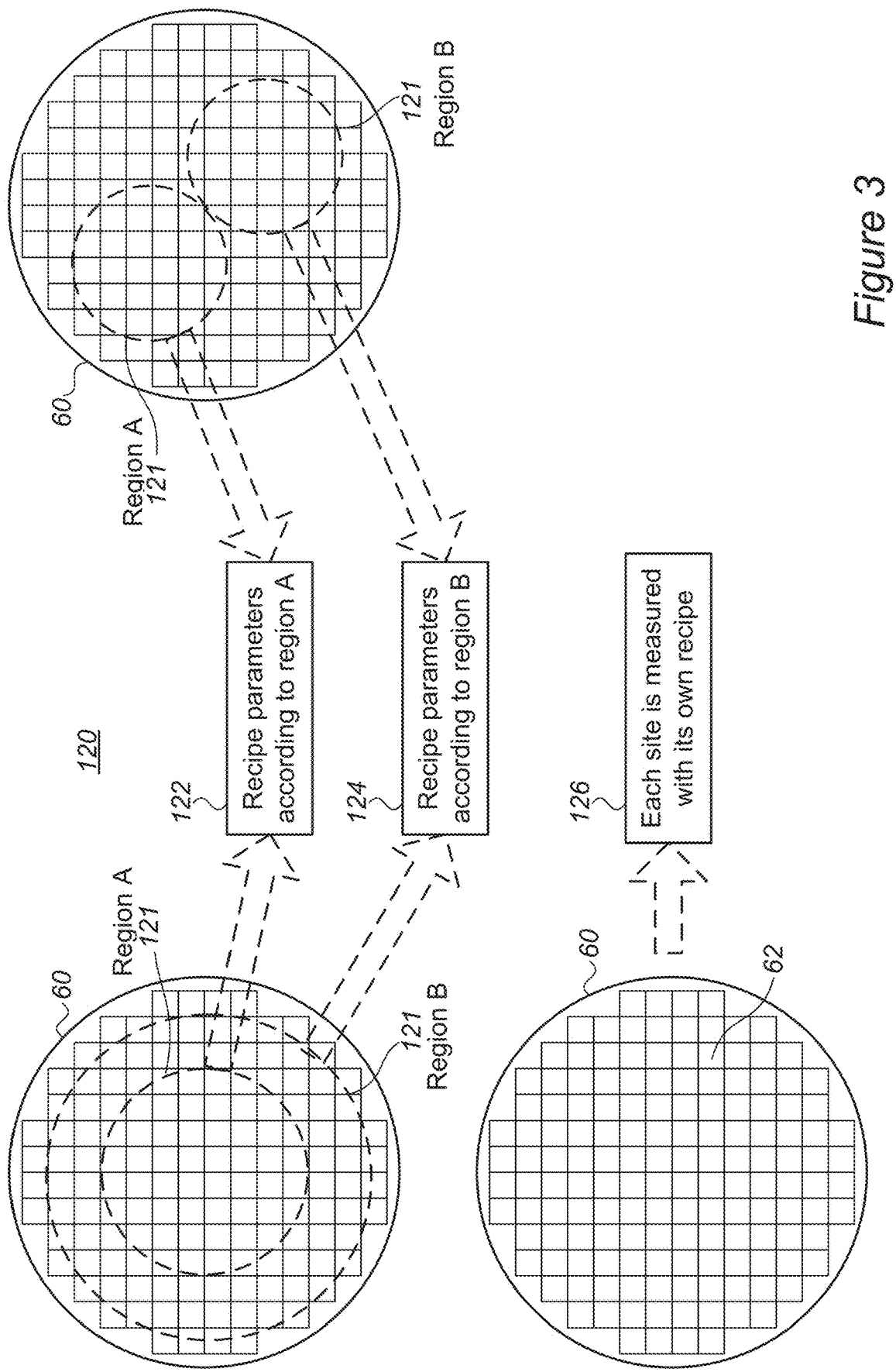
FIG. 3 is a high level schematic illustration of a method of spatial clustering, according to some embodiments of the invention.

FIG. 3 is a high level schematic illustration of a method 120 of spatial clustering, according to some embodiments of the invention. Method 120 may use different recipes to measure different wafer regions 121 (denoted schematically in a non-limiting manner as regions A and B) and/or different sites 62 to yield a spatial clustering of wafer 60 with respect to measurements and/or recipes 111.

The inventors have found out that the accuracy may be improved by allowing setup flexibility across sites 62, wafer regions 121, wafers 60, wafer lots, etc., instead of the traditional metrology method, in which the measurement setup is selected at the train stage and remains fixed for all subsequent target measurements. The term "setup" refers to setting recipe parameters, such as shown schematically in FIG. 2 concerning the parameters according to which landscape 95 is analyzed, such as set by hardware knobs (e.g., focus, spot position, wavelength, polarization, apodization), target design parameters, and/or software parameters (e.g., per-pixel weight, algorithmic thresholds etc.) and so forth. The per-measurement setup may be chosen based on a priori simulations, on-the-fly determination using measurement merits, by some parameterization of the setup parameters and/or by performing multiple per-target measurements and determining the best setup a posteriori. For example, one may use a set of accuracy-related quantities like the variability of the overlay on the pupil (in pupil scatterometry) or the combined overlay sensitivity of the pupil pixels to optimize over and find the best setup on a per-measurement basis.

As illustrated schematically in FIG. 3, sites in different regions 121 on wafer 60 may be measured using different parameters and/or setups 122, 124 and/or different sites 62 on wafer 60 may be measured using different parameters and/or setups 126. Regions 121 may be concentric (e.g., a wafer center and a wafer periphery may be measured using different setups), adjacent or have any other spatial relation. A combination of wafer regions 121 and specific sites 62 may be used to further differentiate the application of different measurement setups.

Advantageously, method 120 may be configured to utilize differences between individual measurements to improve the overall accuracy, especially differences due to process variations and particularly with respect to specific sites 62 or regions 121 which exhibit low measurability or increased inaccuracy for a few targets, when measuring all targets with the same fixed setup. In the landscape representation 95, the flexibility provided by method 120 may enable to adjust the setup per-measurement to be measuring in a favorable region of landscape 95 with respect to measurability and/or accuracy; and avoid changes to landscape 95 due to process variations.

In certain embodiments, the term "region" 121 may also be used to refer to a group of setups with some common landscape-related property, for example a group of succeeding wavelengths which lie on a flat 95B region in landscape 95, such as clusters 112 illustrated schematically in FIG. 2. Method 120 may thus be optionally applied to clusters 112 illustrated schematically in FIG. 2 as regions 121 and similar processing may be used to improve accuracy according to the clustering of setups.

For example, N setup parameters (e.g., hardware and/or software parameters) may be denoted as $\{S_1, S_2, \ldots, S_N\}$, in a linear space V, and the k measurements parameters (lot, wafer, on-wafer location, etc.) may be denoted as $\{M_1, M_2, \ldots, M_k\}$. In certain embodiments, method 120 may implement the per-measurement flexibility in the form of a function S(M), with the setup knobs being determined by the measurement parameters. As a non-limiting example, S(M) may describe the setting the illumination polarization separately for each target location across wafer 60, based on the polarization which yields the best merits.

A more general way to establish the flexibility described above is to apply a mapping of the setup parameters to a generalized set of parameters $P_1, P_2, \ldots, P_L$, so that the setups space is parametrized as functions of these parameters: $S_i = F_i(\{P_j\})$. Method 120 may then comprise finding the function $f(P)$ that is optimal from the point of view of a cost function Q(F) which is related e.g., to the accuracy. The optimization may be carried out with respect to the variability across landscape regions, to setups of pupil-derived metrics like the sensitivity or the overlay per setups\pixel, and so forth.

Referring to FIG. 11 as a high level schematic flowchart, method 120 may comprise selecting a plurality of measurement setups for a corresponding plurality of wafer regions (stage 123), wherein the wafer regions are pre-determined or determined on-the-fly and wherein the measurement setups are selected according to at least one accuracy metric (stage 125), and carrying out metrology measurements with the selected measurement setup for each corresponding wafer region (stage 127). As described above, the measurement setups may be selected according to a clustering of measurements or simulation values of at least one metric by applying a self-consistency test thereto, to yield a plurality of clusters of setups from which a most reliable cluster is determined for each of the wafer regions according to statistical characteristics of the clusters.

Certain embodiments comprise a computer program product comprising a non-transitory computer readable storage medium having computer readable program embodied therewith, the computer readable program configured to carry out any of the stages of method 120; and possibly a metrology module configured to carry out any of the stages of method 120. Any of the relevant stages of method 120 may be carried out by a computer processor, e.g., in processing unit(s) 109.

Noise Reduction

FIG. 4 is a high level schematic flowchart of a method 130 of noise removal and smoothing of the pupil images, according to some embodiments of the invention. Method 130 may comprise pre-processing stages which improve the signal to noise ratio of the overlay and of the pupil derived metrics and algorithms, in any one of the disclosed embodiments and/or independently therefrom. Noise reduction 134 may be applied to the differential signals D1 and D2 (measured by measurement recipes 111) 132 by using a spatial algorithmic filter, for example, one may use a filter that averages a pixel's value with its neighboring pixels' values. Noise reduction may eliminate or reduce noise (unrelated to accuracy, such as random noise) in scatterometry signals which may be caused by different sources and improve the quality of the overlay measurement by means of different pupil metrics and/or the overlay of a specific SCOL measurement. a Method 130 may be used to improve any of the other methods disclosed herein.

Noise reduction may be carried out with or without a symmetrization of the signal 136 with respect to reflection symmetry in the direction perpendicular to the grating direction (i.e., the measurement direction of a periodic structure in target 70). Symmetrization may be applied to produce pupil-derived metrics that characterize the asymmetry in the perpendicular direction 138 and/or to clean the signal from these asymmetries to provide pupil-derived metrics 137 with improved fit to the landscape theory and phenomenology that is derived from simulations 135. For example, various thresholds disclosed herein may be set in a more accurate manner according to simulation-derived values.

Referring to FIG. 11 as a high level schematic flowchart, method 130 may comprise or be complemented by modifying a pixel value in a metrology pupil image according to an average of neighboring pixel values to reduce random noise in the pupil image (stage 134), optionally further comprising symmetrizing pixel values in the pupil images prior to the modifying (stage 136), wherein the symmetrizing is in a direction that is perpendicular measurement direction of a measured periodic structure target.

Certain embodiments comprise a computer program product comprising a non-transitory computer readable storage medium having computer readable program embodied therewith, the computer readable program configured to carry out any of the stages of method 130; and possibly a metrology module configured to carry out any of the stages of method 130. Certain embodiments comprise pupil images derived by one or more stages of method 130. Any of the relevant stages of method 130 may be carried out by a computer processor, e.g., in processing unit(s) 109.

Weighted Pupil Metrics

FIG. 5 is a high level schematic flowchart of a method 140 of improving the metrics over the pupil images, according to some embodiments of the invention. Method 140 may be configured to fuse measurements from multiple recipes to derive weighted pupil images having improved accuracy.

The inventors have found out that concatenating pixels from multiple pupils from multiple measurements which differ from each other in setup and target (e.g., in wavelength, polarization, apodizer, target design etc.) may be used to improve the accuracy of the measurements. Following this concatenation, the overlay (or any other metric 91) may be calculated according to prior art algorithms but using all of the (concatenated) pixels together. Moreover, method 140 may comprise extending prior art overlay algorithms, which take into account the basic feature of sensitivity, to further comprise multiple pupils, while carrying out signal normalization with care, as described below.

Method 140 may comprise concatenating pupil values and/or pupil images 142 from multiple measurements with different setups 141, providing metric(s) for each pupil and deriving multiple-setup weighted metrics 146 to provide more accurate and stable metric 148, as described below.

Furthermore, the inventors have found out, that no further auxiliary storage is required for such a calculation, since the essence of the overlay algorithm can be subdivided to separable sums over a few quantities, so that each pupil is summed before the calculation. It is suggested to use this overlay algorithm during setup as a reference point, as well as during runtime.

The algorithm performs a fit of $D_1$ and $D_2$ to the form $D_{1,2}$(setup,pixel)=A(setup,pixel)×OFFSET$_{1,2}$, where the OFFSET$_{1,2}$ are the offsets of the target cells. The fit may be weighted or may be unweighted with respect to signal characteristics such as the signal strength.

A further improvement of the algorithm involves adding another degree of freedom, denoted $\vec{\beta}$, such that each pupil has an attached $\beta_n$ value. This $\beta$ is used as weighting. This degree of freedom $\beta$ may be optimized so that the overall pixel vector has some extremum feature, such as an extremum of the pupil variability per pupil of signal derived quantities like combination of $D_1$ and $D_2$.

In addition to applying nominal overlay algorithms across all pixels, an additional fit of the form $D_{1,2}$(setup,pixel)=A(setup, pixel)×OFFSET$_{1,2}$+B may be carried out to optimize the respective parameter B to increase the accuracy. An additional improvement may be achieved by using the principal components in the space of $D_1$ and $D_2$.

Advantageously, the disclosed algorithm is particularly stable with respect to different sampling choices. The stability may be measured using 'robustness checks', in which recipes may be algorithmically discarded according to random selection, and the algorithm is applied to the remaining recipes. This stage may be repeated with multiple random realizations, and the different results compared to provide an estimate of the algorithms stability. The ways to measure the comparisons include but are not limited to the overlay difference between the different realizations and a reference overlay, the minimal and maximal distance between the algorithm result and the references, and for the purposes of setup optimization, the changes in the leading recipe under different random realizations.

Referring to FIG. 11 as a high level schematic flowchart, method 140 may comprise or be complemented by deriving a value of a metrology metric from multiple measurements of the metric (stage 146A) using different measurement setups and/or different targets, wherein the value is derived from a concatenation 142 of pixels from the multiple measurements which is carried out with respect to the measurements (stage 142A). Method 140 may further comprise weighting the pixels according to a weighting function and optimizing the weighting function to minimize pupil variation (stage 146B). In certain embodiments, method 140 may further comprise estimating an algorithmic stability by comparing results from multiple concatenations of different sub-sets of the measurements and/or measurement recipes and/or measured targets (stage 147).

Certain embodiments comprise a computer program product comprising a non-transitory computer readable storage medium having computer readable program embodied therewith, the computer readable program configured to carry out any of the stages of method 140; and possibly a metrology module configured to carry out any of the stages of method 140. Certain embodiments comprise signals such as concatenated pupil images and/or pixels, which are derived by one or more stages of method 140. Any of the relevant stages of method 140 may be carried out by a computer processor, e.g., in processing unit(s) 109.

Variation Analysis Among Recipes

FIG. 6 is a high level schematic flowchart of a method 150 of analyzing variation among recipes, according to some embodiments of the invention. Method 150 may comprise using principal component analysis (PCA) 154 on differential signals 152 to analyze variation among recipes.

The inventors observed that while in an ideal scatterometry measurement the differential signals $D_1$ and $D_2$ of the various pixels should all reside on the locus $D_1 \propto D_2$, real measurements are noisy and may contain either seemingly random noise which may cause the pixel's linear distribution to widen and/or may add bias to $D_1$, or $D_2$ or both. The inventors have found out that the quality of the pupil data may be inferred from the ratio of the height and width of the scatter plot of the pixels in the x,y-plane. More specifically, the principal axes of the scatter plot in the $D_1$-$D_2$-plane may be determined by applying PCA 154, by diagonalizing the covariance matrix defined by $$\begin{pmatrix} \text{Var}(D_1) & \text{Cov}(D_1, D_2) \\ \text{Cov}(D_1, D_2) & \text{Var}(D_2) \end{pmatrix}.$$

The eigenvectors and eigenvalues 156 of the covariance matrix may be used determine the overlay.

The quality of the result may be determined by the ratio of the shortest to longest principal values, i.e., by the ratio of the smaller to larger eigenvalues—the lower the ratio, the higher the quality of the overlay obtained. Biases in $D_1$ and/or in $D_2$ are automatically handled by this procedure since the principal axes are impervious to translation of the origin.

Method 150 may further comprise taking pixels from multiple measurement setups (multiple wavelengths, multiple target designs, multiple polarizations, different apodizers and/or other tool knobs), as exemplified in method 140, and may also be applied to any combination of pupil pixel and setup and so applies to both pupil- and field-scatterometry, and may be used to improve method 120, for evaluation and clustering the recipes 158.

Referring to FIG. 11 as a high level schematic flowchart, method 150 may comprise or be complemented by deriving a measurement setup by applying a PCA to a plurality of metrology measurements from using a plurality of setups (stage 154A) and selecting a measurement setup which exhibits a smallest ratio of small to large eigenvalues from the PCA (stage 156A), e.g., with respect to the covariance matrix. Method 150 may further comprise applying the PCA to a plurality of pixels from the metrology measurements (stage 159), possibly concatenated from multiple measurements, and possibly from metrology measurements that comprise both pupil- and field-scatterometry measurements.

Certain embodiments comprise a computer program product comprising a non-transitory computer readable storage medium having computer readable program embodied therewith, the computer readable program configured to carry out any of the stages of method 150; and possibly a metrology module configured to carry out any of the stages of method 150. Any of the relevant stages of method 150 may be carried out by a computer processor, e.g., in processing unit(s) 109.

Algorithm Validity Flags

Referring to FIG. 11 as a high level schematic flowchart, method 160 of deriving, providing and utilizing algorithm validity flags is presented, and explained in detail below. Method 160 comprises indicating inaccuracy in metrology measurements by calculating a difference between at least two values of at least one metrology metric, the at least two values derived from at least two metrology algorithms (stage 163), and setting a threshold for the calculated difference (stage 164). In certain embodiments, method 160 further comprises reporting the difference as a flag indicator for measurement inaccuracy (stage 166) and possibly using the algorithm validity flag to improve accuracy and/or to further characterize the landscape (stage 168).

Figure 7:
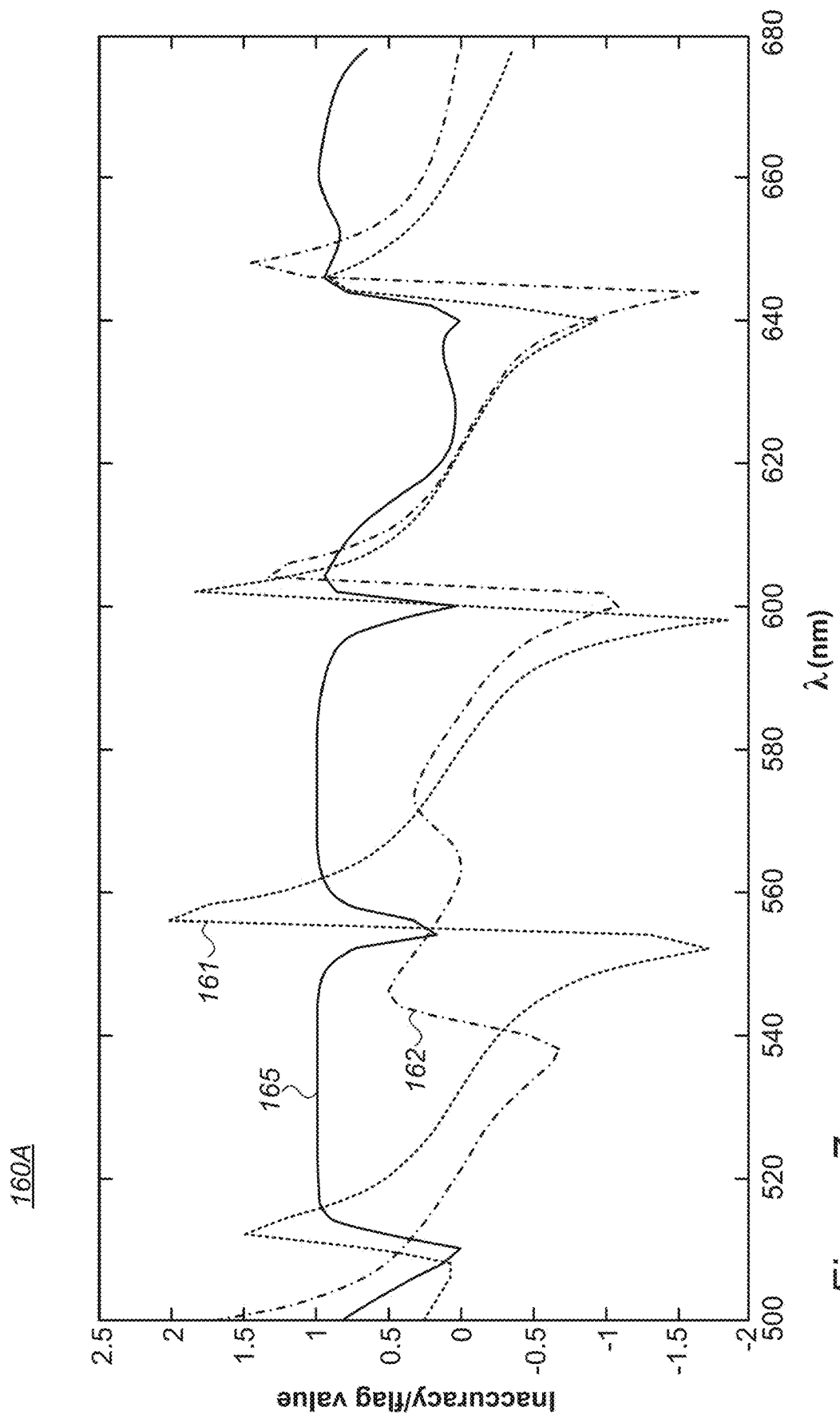
FIG. 7 is a high level schematic examplary illustration of an algorithm validity flag and its derivation by the corresponding method, according to some embodiments of the invention.

FIG. 7 is a high level schematic examplary illustration 160A of an algorithm validity flag 165 and its derivation by method 160, according to some embodiments of the invention. Algorithm validity flag 165 may be used to evaluate inaccuracies by comparing results from different algorithms. The inventors have found out that accuracy may be improved by using the pupil metric disclosed below.

In the scatterometry overlay (SCOL) metrology the signals are expected to behave in an idealized way, which, in the linear approximation, means that the differential signals $D_1$ and $D_2$, the overlay per-pixel and per-setup on the pupil in pupil scatterometry or the overlay per-setup in field scatterometry are determined by the proportionality coefficient between $D_1$ and $D_2$. Denoting the true overlay by $\epsilon$, the inaccuracy $\delta\epsilon_{per-pixel}$ is given, in the linear approximation, by Equation 1, $$\delta\epsilon_{per-pixel} = \epsilon_{per-pixel} - \epsilon = u \times f(D_1, D_2) \quad \text{Equation 1}$$

with u being the per-pixel and/or per-setup deviation from the ideal signal (i.e., the deviation from the signal of an ideal target, with no inaccuracy) and $f(D_1, D_2)$ being a well-defined function that depends on the algorithm. For example, $f(D_1, D_2)$ may be $\langle(D_1-D_2)^{-5}\rangle$, where the brackets denote an average over measurement conditions. The functional form of $\delta\epsilon_{per-pixel}(u)$ may be determined as follows.

Given any concrete model for the deviation from the ideal signal u, an algorithm may be devised, which fits the model to the measured signal and provides an estimate of the overlay. However, the accuracy provided by different algorithms depends on the accuracy of the assumptions upon which they is based, so that there is a need for a method of comparing the accuracy of different algorithms. Method 160 provides a way to test the assumptions on which an algorithm is based, which goes beyond the usual goodness of fit measures.

By the using the aforementioned model-based algorithm one gets estimates $f_{algo}(D_1, D_2)$ and $u_{algo}$, the deviation from the ideal signal. These, in turn may be used to estimate various measurable quantities of another algorithm (for example, of the nominal scatterometry algorithm), in a non-limiting example, the variance of the per-pixel overlay over the pupil, which can then be compared to the measured quantities. Any mismatch is an indication that the assumptions behind the model on which the algorithm is based are not valid. In a non-limiting example, the variance off and u divided by the measured variance may be used as the flag. It is noted that due to the definition off, such a flag may be different from the actual variance. Any other appropriate flag may be used.

Method 160 may be configured to provide flag 165 which is derived from the inaccuracies of two different algorithms 161, 162. Flag 165 is illustrated in FIG. 7 to drop below one, when the assumptions behind algorithm 161 fail, as is evident by the high inaccuracy of algorithm 161 in the regions of flag 165 being smaller than one.

Certain embodiments comprise a computer program product comprising a non-transitory computer readable storage medium having computer readable program embodied therewith, the computer readable program configured to carry out any of the stages of method 160; and possibly a metrology module configured to carry out any of the stages of method 160. Any of the relevant stages of method 160 may be carried out by a computer processor, e.g., in processing unit(s) 109. Certain embodiments comprise a flag indicator signal comprising the calculated difference as disclosed herein.

Detection of Regions which are Proximate to Resonance Regions

Referring to FIG. 11 as a high level schematic flowchart, method 170 is presented of deriving, providing and utilizing indications of regions that are proximate to resonance regions, and explained in detail below. Method 170 comprises indicating a proximate region in a landscape which is proximate to a resonance region (stage 176), wherein the landscape comprises an at least partially continuous dependency of at least one metrology metric on at least one parameter and the resonance region in the landscape corresponds to a resonance of optical illumination in a measured location. Indicating 176 may be carried out by calculating a variability of pupil signal or at least one function thereof (stage 172), and comparing the calculated variability with a predefined threshold, wherein surpassing the predefined threshold indicates the proximate region (stage 174).

Figure 8:
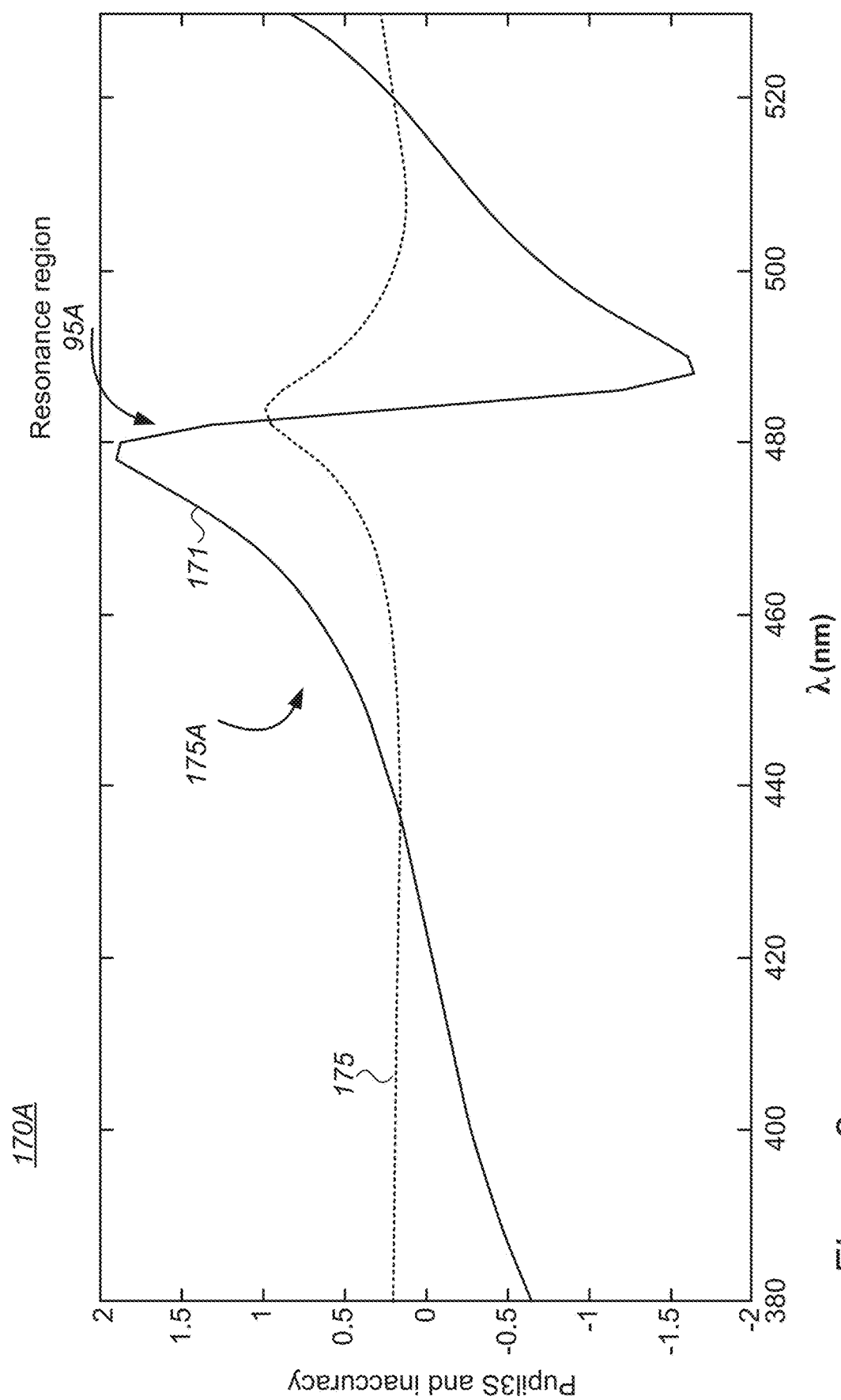
FIG. 8 is a high level schematic examplary illustration of a flag that indicates proximate regions(s) and their derivation by the corresponding method, according to some embodiments of the invention.

FIG. 8 is a high level schematic examplary illustration 170A of a flag 175 that indicates proximate regions(s) 175A and their derivation by method 170, according to some embodiments of the invention. Resonance proximity flag 175 may be used to indicate resonance regions 95A, flat regions 95B and intermediate regions 95C, and in particular proximate regions 175A which indicate that the recipe or setup approach a resonant region which is characterized by high inaccuracy. The inventors have found out that accuracy may be improved by using the pupil metric disclosed below.

In pupil scatterometry measurements resonances can be detected by the existence of certain features in the pupil, such as zero-sensitivity pixels in the sensitivity pupil described in WIPO Publication No. 2014062972. However, it is desirable to detect also the vicinity of resonances in order to indicate approaching resonant regions. The vicinity of resonances may be detected by computing the variability of the pupil signals and/or any functional combination of them (stage 172). Far from resonances 95A, this ratio has a value close to zero (see flag 175 in illustration 170A). In particular, flag 175 is equal to zero if the pupil signal is flat, which has been found to correspond to flat region 95B in landscape 95. Approaching to resonances 95A the value of flag 175 increases, close to resonances 95A the value of flag 175 is large, and at the peak of the value of flag 175 or very close thereto, the contours of inaccuracy are most prominent in the pupil image, at resonance region 95A of landscape 95. Illustration 170A presents a non-limiting example of the changing of inaccuracy 171 and flag 175 as function of wavelength as the measurement parameter, at proximate region 175A and at resonance region 95A (at which illumination resonances in the measured stack).

Certain embodiments comprise a computer program product comprising a non-transitory computer readable storage medium having computer readable program embodied therewith, the computer readable program configured to carry out any of the stages of method 170; and possibly a metrology module configured to carry out any of the stages of method 170. Any of the relevant stages of method 170 may be carried out by a computer processor, e.g., in processing unit(s) 109. Certain embodiments comprise a flag indicator signal comprising the calculated variability and/or the proximate regions as disclosed herein.

Identification of Non-Analytical Behavior of the Landscape

Figure 9:
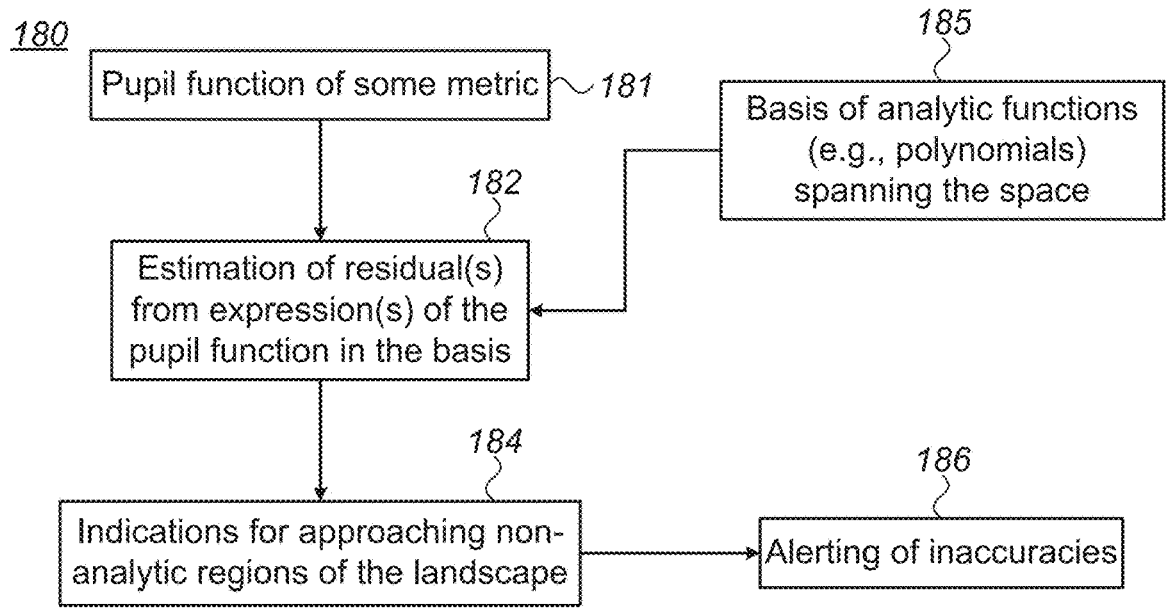
FIG. 9 is a high level schematic flowchart of a method of identifying of non-analytical behavior of the landscape, according to some embodiments of the invention.

FIG. 9 is a high level schematic flowchart of a method 180 of identifying of non-analytical behavior of the landscape, according to some embodiments of the invention. Method 180 may comprise improving accuracy by using the following pupil metric, which detects non-analytical (and analytical) behavior of various quantities on the pupil in pupil scatterometry, to detect resonances 95A and flat regions 95B. Moreover, the inventors have found out that in both pupil- and field-scatterometry, non-analytic behavior of various quantities as functions of various tool knobs (e.g., wavelength and/or polarization as non-limiting examples) may be used to detect resonances 95A and flat regions 95B.

The inventors have found out that certain functions on the pupil 181 (in a non-limiting example, the per-pixel overlay) behave non-analytically near resonant regions 95A. Similarly, certain functions in pupil- and field-scatterometry behave non-analytically as functions over setups (which may include wavelength, polarization, etc., as described above, see FIG. 2). This non-analytic behavior can be detected by fitting pupil function 181 to a basis of functions 185 which spans (at least at good approximation) the space $\mathcal{A}$ of analytical functions on the pupil (available in pupil-scatterometry) and/or in the setup space (available in both pupil- and field-scatterometry).

Basis 185 of analytic functions that spans the space $\mathcal{A}$ sufficiently well is denoted by $\{f_i(k,s)\}_{i=0}^N$, where k stands for the pupil coordinates and s stands for generalized coordinates in setup space. The projection of a function $f(k)$ on the space $\mathcal{A}$ is given approximately by minimizing the function expressed in Equation 2 with respect to the coefficients $a_i$, where the norm is defined to be a function bounded from below (residual 182).

$$\chi^2(\{a_i\}) = \int d^2k \, ds \text{Norm}(f(k,s) - \Sigma_{i=1}^N a_i f_i(k,s)) \quad \text{Equation 2}$$

The inventors have observed that an analytic function on the pupil and/or setup space has a small residual $\chi^2$ 182, while a non-analytic function has a higher residual 182, even if its divergence lies outside of the pupil. Therefore, indications 184 for approaching non-analytic regions of landscape 95 may be generated according to the value of residual 182 (e.g., with respect to a predefined threshold) and may be used to provide alerts 186 of inaccuracies.

The inventors have found out that the major power of suggested method 180 is derived from its sensitivity regime—because not only a pupil and/or a setup region that includes a singularity has a large residual 182 $\chi^2(\{a_i\})$, but also pupils and/or setups 'near' a singularity (e.g., proximate regions 175A) may exhibit a large residual 182. The definition of 'near' in the pixel-setup space includes at least small setup changes and process variations. Therefore, residual 182, $\chi^2(\{a_i\})$, may be used to assess whether unexpected changes in the process or the tool could impact the accuracy of the measurements.

Referring to FIG. 11 as a high level schematic flowchart, method 180 of determining resonant regions in the landscape (wherein the landscape comprises an at least partially continuous dependency of at least one metrology metric on at least one parameter and the resonance region in the landscape corresponds to a resonance of optical illumination in a measured location) may comprise or be complemented by detecting non-analytic behavior of at least one metrology metric (stage 180A) comprising: spanning a space of the analytic functions over pupil coordinates by a basis of analytic functions (stage 185A), expressing the metrology metric in terms of the basis of analytic functions (stage 185B) and estimating a residual of the expression(s) (stage 182), wherein a residual larger than a predetermined threshold indicates the non-analytic behavior (stage 186A).

Certain embodiments comprise a computer program product comprising a non-transitory computer readable storage medium having computer readable program embodied therewith, the computer readable program configured to carry out any of the stages of method 180; and possibly a metrology module configured to carry out any of the stages of method 180. Any of the relevant stages of method 150 may be carried out by a computer processor, e.g., in processing unit(s) 109. Certain embodiments comprise a flag indicator signal comprising the estimations as disclosed herein.

Diagonal Target Cells

Figure 10:
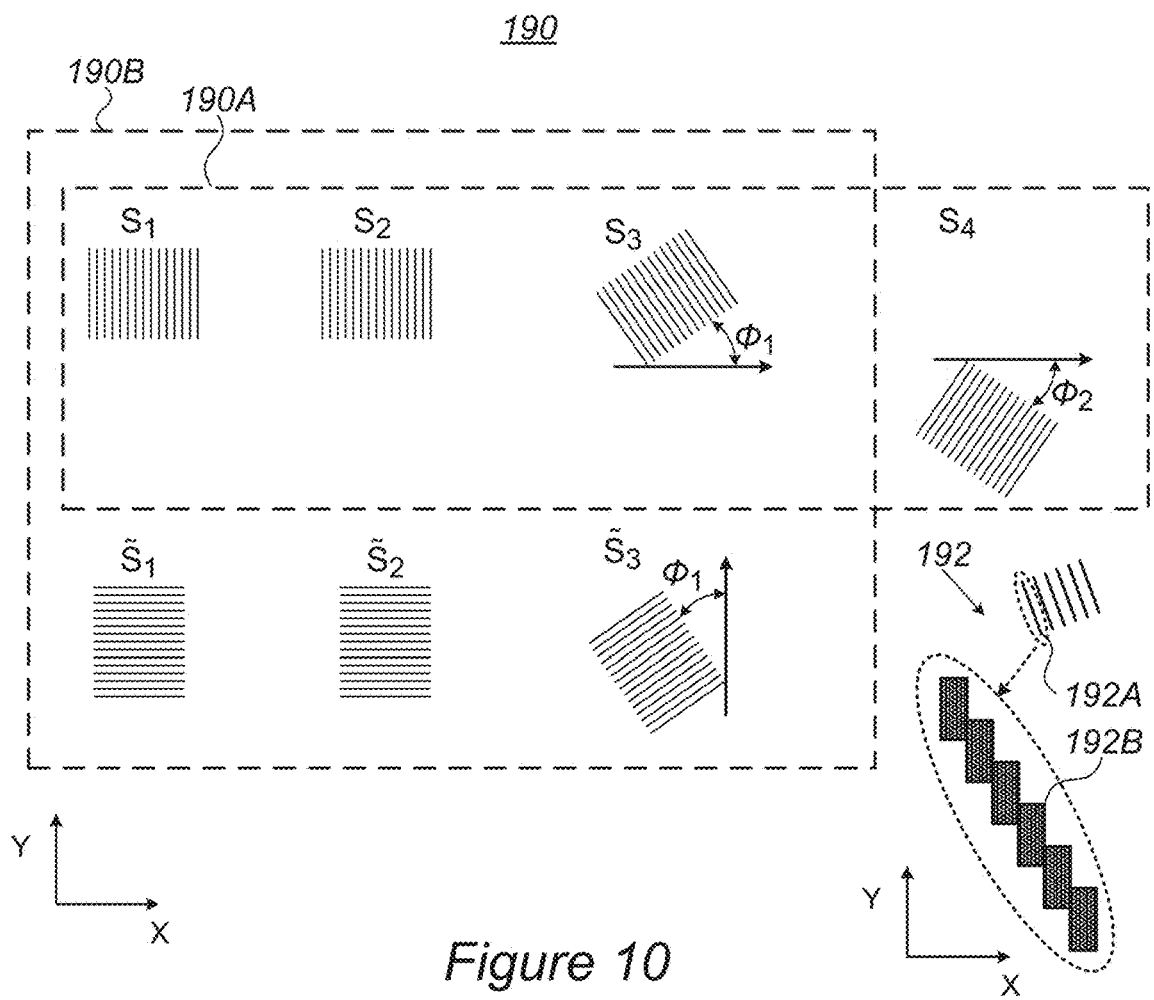
FIG. 10 is a high level schematic illustration of examplary, non-limiting target designs with diagonal cells, according to some embodiments of the invention.

The inventors have further found, that addition of diagonal target cells to target designs and/or target designs which comprise diagonal cells, may provide improved accuracy of the measurements in various embodiments of the invention. For example, FIG. 10 is a high level schematic illustration of examplary, non-limiting target designs 190 with diagonal cells, according to some embodiments of the invention.

Metrology targets 190 may comprise a plurality of target cells (denoted schematically by $S_1$, $S_2$, $S_3$, $S_4$, $\tilde{S}_1$, $\tilde{S}_2$, $\tilde{S}_3$, having periodic structures along at least two different and non-perpendicular measurement directions, e.g., one of X or Y and any of the oblique directions denoted by $\phi_1$, $\phi_2$. The cells are grouped in an examplary non-limiting manner into two alternative target designs 190A (along the X direction with two alternative skewed cells $S_3$, $S_4$) and 190B (along the X and Y directions with two alternative skewed cells $S_3$, $\tilde{S}_3$). At least one of the measurement directions may be at an angle $\phi$ (e.g., $\phi_1$, $\phi_2$) to another measurement direction (e.g., X, Y), wherein the angle $\phi$ is selected to reduce an effect of target cell asymmetry. In certain embodiments, the measurement directions may comprise at least three measurement directions at angles different from 0° and 90° with respect to each other (e.g., X, Y and two $\phi_1$ in target design 190B). It is noted that skewed cells (e.g., $S_3$, $S_4$, $\tilde{S}_3$) may comprise elements 192A of the respective periodic structures which are designed to be oblique to measurement axis X, yet comprise sub-elements 192B which are along or perpendicular to measurement axis X (in the illustrated non-limiting case, along perpendicular axis Y), in order to enhance the printability of the skewed cells, while maintaining their skew design—as illustrated in detail 192. In the following, details of target designs 190 are explained in a non-limiting manner with respect to target designs 190A, 190B, and the accuracy improvements are demonstrated.

The conventional SCOL algorithm, e.g., a four-cell SCOL algorithm, relies on the inversion symmetry of the diffraction gratings composing the target cells (each target cell comprises a periodic structure along measurement direction X or perpendicularly thereto, in direction Y). The inventors have found out that in practice this assumption is violated to a certain degree due to different process variations, which lead eventually to the inaccuracy of the overlay measurement. Certain embodiments provide target rotation algorithms designed to get rid of the requirement of the inversion symmetry of the constituent gratings (periodic structures). This is achieved by using several target cells with different and non-orthogonal directions of the periodicity.

Each cell may be composed of the grating over grating (two periodic structures in two different layers and along the same measurement direction), as in the conventional scatterometry targets. In some cells, certain intentional overlay (offset) may be introduced between the top and the bottom gratings. The difference from the conventional SCOL target is that some cells have their periodicity direction different from the X or Y axes. The target cell designs shown in FIG. 10 are merely illustrative, and omit in a non-limiting manner, details of design such as the two or more periodic structures along the same measurement direction (one over the other or side by side), the offsets therebetween, as well as segmentation and dummification details.

Disclosed target designs 190 cause the scatterometry metrology signal from the skewed cells to be sensitive to the projection of the overlay onto the cell periodicity direction. As the overlay measured by a cell transforms like a vector under the rotation of the cell, the sensitivity of the scatterometry signal to the parasitic target asymmetry undergoes a different type of the transformation, either completely different, or partially different, depending, e.g., on the combination of the target design and the specific manufacturing process. In this manner, the overlay information may be decoupled from the information related to the parasitic target asymmetry. Using the difference in the transformation properties of the scatterometry signal sensitivity to the overlay, at one hand, and the parasitic asymmetries, on the other hand, a modeling for the latter may be developed and used for the practical implementation of the decoupling, as exemplified in non-limiting examples below, of four-cell target 190A and six-cell target 190B. The number and orientations of the cells may be designed and adjusted according to details of specific requirements.

Target design 190A comprises four cells denoted $S_1$, $S_2$, $S_3$, $S_4$ and has the parameters listed in Table 1, with the overlay vector being defined as $\vec{\varepsilon} = \varepsilon_x \hat{x} + \varepsilon_y \hat{y}$.

TABLE 1

An example for a four-cell architecture

| Cell index | Grating direction $\hat{\tau}$ | Induced offset | Total cell offset (OF) |
|---|---|---|---|
| 1 | $\hat{\tau} = \hat{x}$ | 0 | $\varepsilon_x$ |
| 2 | $\hat{\tau} = \hat{x}$ | $f_0 \neq 0$ | $f_0 + \varepsilon_x$ |
| 3 | $\hat{\tau} = \hat{x} \cos \phi_1 + \hat{y} \sin \phi_1$ | 0 | $\varepsilon_x \cos \phi_1 + \varepsilon_y \sin \phi_1$ |
| 4 | $\hat{\tau} = \hat{x} \cos \phi_2 + \hat{y} \sin \phi_2$ | 0 | $\varepsilon_x \cos \phi_2 + \varepsilon_y \sin \phi_2$ |

For each cell, the differential signals are calculated as a difference between the plus and minus first diffraction orders at the inversion symmetric pupil points. For brevity, in the following the dependence of the differential signal on the pupil point coordinate is omitted. The modelling assumption is that the differential signal has the same functional dependence on the total offset OF for all cells, irrespectively of the grating direction $\hat{\tau}$, which is written in the linear approximation as in Equation 3.

$$D(OF) = D(0) + D'(0) \cdot OF \quad \text{Equation 3}$$

This assumption is possible for relatively small angles $\phi_1$, $\phi_2$, but becomes inconsistent for large angle.

For the four cells of target 190A, the following differential signals are expected, as expressed in Equations 4, which constitute a linear system with four unknowns:

$$D_1 = D(0) + D'(0) \cdot \varepsilon_x$$

$$D_2 = D(0) + D'(0) \cdot (f_0 + \varepsilon_x)$$

$$D_3 = D(0) + D'(0) \cdot (\varepsilon_x \cos \phi_1 + \varepsilon_y \sin \phi_1)$$

$$D_4 = D(0) + D'(0) \cdot (\varepsilon_x \cos \phi_2 + \varepsilon_y \sin \phi_2) \quad \text{Equations 4}$$

Equations 4 may be reduced to Equations 5:

$$\begin{cases} \varepsilon_x(1-\cos\phi_1) - \varepsilon_y\sin\phi_1 = f_0\dfrac{D_1-D_3}{D_2-D_1} = A \\ \varepsilon_x(1-\cos\phi_2) - \varepsilon_y\sin\phi_2 = f_0\dfrac{D_1-D_4}{D_2-D_1} = B \end{cases} \quad \text{Equation 5}$$

Equations 5 may solved for the overlay components, as expressed in Equations 6, for the overlay vector $\vec{\varepsilon} = \varepsilon_x\hat{x} + \varepsilon_y\hat{y}$:

$$\varepsilon_x = \frac{A\sin\phi_2 - B\sin\phi_1}{(1-\cos\phi_1)\sin\phi_2 - (1-\cos\phi_2)\sin\phi_1} = \frac{A\sin\phi_2 - B\sin\phi_1}{\sin\phi_2 - \sin\phi_1 + \sin(\phi_1 - \phi_2)} \quad \text{Equation 6}$$

$$\varepsilon_y = \frac{A(1-\cos\phi_2) - B(1-\cos\phi_1)}{(1-\cos\phi_1)\sin\phi_2 - (1-\cos\phi_2)\sin\phi_1} = \frac{A(1-\cos\phi_2) - B(1-\cos\phi_1)}{\sin\phi_2 - \sin\phi_1 + \sin(\phi_1 - \phi_2)}$$

In a non-limiting manner, Table 2 provides the expressions for two particular examples of the relation between the angles $\phi_1$, $\phi_2$.

TABLE 2

Two non-limiting examples for parameters of target design 190A.

| Example 1 | Example 2 |
|---|---|
| $\phi_1 = \phi,\ \phi_2 = 2\phi$ | $\phi_1 = -\phi_2 = \phi$ |
| $\begin{cases} \varepsilon_x = \dfrac{B - 2A\cos\phi}{4\sin^2\dfrac{\phi}{2}} \\ \varepsilon_y = \dfrac{B - 4A\cos^2\dfrac{\phi}{2}}{2\sin\phi} \end{cases}$ | $\begin{cases} \varepsilon_x = \dfrac{(A+B)}{4\sin^2\dfrac{\phi}{2}} \\ \varepsilon_y = \dfrac{B - A}{2\sin\phi} \end{cases}$ |

Target design 190B comprises six cells denoted $S_1$, $S_2$, $S_3$, $\tilde{S}_1$, $\tilde{S}_2$, $\tilde{S}_3$ and has the parameters listed in Table 3, with the overlay vector being defined as $\vec{\varepsilon} = \varepsilon_x\hat{x} + \varepsilon_y\hat{y}$.

TABLE 3

An example for a six-cell architecture

| Cell index | Grating direction $\hat{\tau}$ | Induced offset | Total cell offset (OF) |
|---|---|---|---|
| 1 | $\hat{\tau} = \hat{x}$ | 0 | $\varepsilon_x$ |
| 2 | $\hat{\tau} = \hat{x}$ | $f_0 \neq 0$ | $f_0 + \varepsilon_x$ |
| 3 | $\hat{\tau} = \hat{x}\cos\phi_1 + \hat{y}\sin\phi_1$ | 0 | $\varepsilon_x\cos\phi_1 + \varepsilon_y\sin\phi_1$ |
| 4 | $\hat{\tau} = \hat{y}$ | 0 | $\varepsilon_y$ |
| 5 | $\hat{\tau} = \hat{y}$ | $f_0 \neq 0$ | $f_0 + \varepsilon_y$ |
| 6 | $\hat{\tau} = -\hat{x}\sin\phi_1 + \hat{y}\cos\phi_1$ | 0 | $-\varepsilon_x\sin\phi_1 + \varepsilon_y\cos\phi_1$ |

Three cells in target design 190B, $S_1$, $S_2$, $S_3$, constitute a x-set of cells (with respect to measurement direction X), and the other three cells, $\tilde{S}_2$, $\tilde{S}_3$, constitute a y-set of cells (with respect to measurement direction Y). For each set the differential signal parameters expressed in Equations 7 may be assumed:

$$D_x(OF) = D_x(0) + D_x'(0) \cdot OF;\ D_y(OF) = D_y(0) + D_y'(0) \cdot OF \quad \text{Equations 7}$$

The modelling assumption is that the differential signal have same functional dependence on the total offset OF for all cells in a given set irrespectively of the grating direction $\hat{\tau}$. This assumption is plausible for relatively small angle $\phi_1$, but will become inconsistent for large angle.

For the six cells of target 190B, the following differential signals are expected, as expressed in Equations 8, which constitute a linear system with six unknowns:

$$D_1 = D_x(0) + D_x'(0) \cdot \varepsilon_x$$

$$D_2 = D_x(0) + D_x'(0) \cdot (f_0 + \varepsilon_x)$$

$$D_3 = D_x(0) + D_x'(0) \cdot (\varepsilon_x\cos\phi_1 + \varepsilon_y\sin\phi_1)$$

$$D_4 = D_y(0) + D_y'(0) \cdot \varepsilon_y$$

$$D_5 = D_y(0) + D_y'(0) \cdot (f_0 + \varepsilon_y)$$

$$D_6 = D_y(0) + D_y'(0) \cdot (-\varepsilon_x\sin\phi_1 + \varepsilon_y\cos\phi_1). \quad \text{Equations 8}$$

Equations 8 may be reduced to Equations 9:

$$\begin{cases} \varepsilon_x(1-\cos\phi_1) - \varepsilon_y\sin\phi_1 = \dfrac{D_1-D_3}{D_x'(0)} = f_0\dfrac{D_1-D_3}{D_2-D_1} = A \\ \varepsilon_x\sin\phi_1 + \varepsilon_y(1-\cos\phi_1) = \dfrac{D_4-D_6}{D_y'(0)} = f_0\dfrac{D_4-D_6}{D_5-D_4} = B \end{cases} \quad \text{Equation 9}$$

Equations 9 may solved for the overlay components, as expressed in Equations 10, for the overlay vector $\vec{\varepsilon} = \varepsilon_x\hat{x} + \varepsilon_y\hat{y}$:

$$\begin{cases} \varepsilon_x = \dfrac{A(1-\cos\phi_1) + B\sin\phi_1}{2 - 2\cos\phi_1} \\ \varepsilon_y = \dfrac{B(1-\cos\phi_1) - A\sin\phi_1}{2 - 2\cos\phi_1} \end{cases} \quad \text{Equation 10}$$

The examples given above used a specific modelling assumption made for the exemplification purposes. In practice, different assumption could be used, e.g., based on simulations or calibration measurements or theory, and provide a likewise sound basis for using target designs 190 to improve the accuracy of the metrology measurements, in particular with respect to asymmetric process variation.

Referring to FIG. 11 as a high level schematic flowchart, target design method 195 may comprise adding to target cells having periodic structures along a measurement direction, at least one skewed target cell having a different and non-perpendicular direction with respect to the measurement direction (stage 196), and optionally, designing the at least one skewed target cell to have a direction at an angle $\phi$ to the measurement direction, wherein the angle $\phi$ is selected to reduce an effect of target cell asymmetry (stage 197).

Certain embodiments comprise a computer program product comprising a non-transitory computer readable storage medium having computer readable program embodied therewith, the computer readable program configured to carry out any of the stages of method 195; and possibly a target design module configured to carry out any of the stages of method 195. Any of the relevant stages of method 195 may be carried out by a computer processor, e.g., in processing unit(s) 109. Certain embodiments comprise target design file(s) and/or measurement signals of corresponding targets 190, possibly derived by method 195, as disclosed herein.

Any of the disclosed methods and tools may be combined in actual metrology methods and tools in any operable combination to add up the benefits provided by different embodiments and aspects of the disclosed invention. For example, stages from methods 100, 120, 130, 140, 150, 160, 170, 180 and 195 may be combined. For example, any of the following embodiments may be used separately or combined:
- (i) Using self-consistency as an indicator and test for accuracy in metrology. Defining the diversity and independence of setups and the use of clustering methods to perform the self-consistency tests (see e.g., method 100). In particular, Diversity may be expressed by the identification of measurements that are found to be independent. The dependency may be found by correlation of pupil derived metrics. Clustering may be found by graph theoretic or machine learning techniques such as cliques, hierarchical clustering or distribution based clustering. When clustering is done the thresholds may be determined a priory or by an iterative process such finding a plateau or an intrinsic scale. Each measurement may be handled as a point in n dimensional space, for example measurements on n locations on a wafer. Dimension reduction maps this space into lower dimensional space of parameters of interest. Once all the clusters have been identified, ranking the clusters is performed with collective group metrics or with metrics of representatives.
- (ii) Allowing setup-flexibility such that each measurement may be made with an individual set of setup parameters, in order to increase robustness to process variations, improve measurability, and decrease inaccuracy, without significantly degrading the MAM (move-acquire-measure) time (see, e.g., methods 100 and 120). The optimization of accuracy in the landscape may be achieved by finding parametric sub-spaces in the landscape having a better accuracy than achieved in the prior art by simple fixing of specific measurement parameters. The combination of parameters provided by such sub-spaces enables to change multiple parameters together in a correlated manner and as a function of space and/or time. Additionally, combinations of disclosed methods provide finding setups that are best correlated to external references in a way that treats the uncertainties involved, as well as the use of self-consistency, clustering algorithms, etc. in setup optimization and control by use of advanced algorithms.
- (iii) In certain coordinate systems, the slope of the large principal axis provides information on the overlay free of certain types of inaccuracy-causing biases (see e.g., method 130). The use of noise reduction techniques in pupil scatterometry comprises Y-symmetrization, filtering and pupil calibration with reference images
- (iv) The fusion of measurements into a single one and generalizing the nominal overlay algorithms or generalization thereof (see e.g., method 140). Advanced pupil analysis and the merging of setups into generalized pupils improve the accuracy of the measurements. Combining multiple measurements from multiple setups in pupil space further improves accuracy. Moreover, disclosed methods provide an optimization of the weighing in combined pupil space of multiple measurements by extremizing a pupil derived metric.
- (v) The ratio between the large and small eigenvalues of the covariance matrix gives an indication of the stability of the measurement and its error (see e.g., method 150). Moreover, computing the overlay and its quality by using the principal components of multiple pixels, measurements and setups further increases the achieved accuracy of the measurements.
- (vi) Using an estimation of the deviation of the pupil scatterometry signal from its ideal form obtained from an algorithm based on modeling the signal, a measure of the validity of the assumptions at the basis of that model may be derived, by using the knowledge of the deviation in order to predict other measureable quantities. Failure of these predictions to match the measurements serves as an indication that the assumptions at the base of the model-based algorithm failed (see e.g., method 160). Flags for testing the validity of the assumptions at the basis of a model to which the measured data is fitted by using its prediction for other measureable quantities.
- (vii) A set of flags which indicate a nearby resonance in the landscape by checking the variance of the signal across its independently defined sub-measurements like pupil pixels in pupil scatterometry or signal harmonics in imaging (see e.g., method 170). Some flags may be used to detect resonances even when a zero-sensitivity contour is not present on the pupil by using the variability and the analyticity of appropriate functions on the pupil. Disclosed methods allow the use of resonant setups and other setups which are deemed inadequate for single setup algorithms in the prior art.
- (viii) The detection of non-analytic behaviors in the signal that reflect near-by resonance behavior and/or contrast reversals in the signal of the involved setup and\or close to it on the landscape (see e.g., method 180).
- (ix) Novel target design that uses the different representations of the rotation group for the overlay and for the pattern asymmetry to separate signal asymmetry from the overlay and signal asymmetry from bar asymmetry (see e.g., method 195 and targets 190). The novel target designs allow to decouple the overlay from the pattern asymmetry and, thus, to relax the critical assumption of the target pattern inversion symmetry applied in the standard overlay scatterometry targets.

Combinations of these embodiments provide the following examplary advantages over the prior art:
- (i) Reduced sensitivity to the initial set of setups due to graph theoretic properties.
- (ii) Provision of a more faithful description of the structure of relations between setups and their grouping.
- (iii) Identification of equivalence classes in data, and avoidance of over-representation of physically similar measurements or recurring recipes.
- (iv) Ranking of different clusters, derived from collective properties of cluster members or properties of a representative recipe of each cluster.
- (v) Novel flags that derive their existence and usefulness from global features of the landscape and reflected in self-consistency.
- (vi) Indications of proximity to problematic measuring conditions (resonances), even at some distance away from the resonances leading to measurements more robust to symmetric process variations.
- (vii) Detection of the validity of model-based algorithms on a given set of measured data enabling the selection of an accurate model-based algorithm for a given set of measured data.
- (viii) Removal of some biases from overlay measurements and assessing the quality of the measurements based on the distribution of the measurements (where each pixel counts as a measurement) in the differential signals plane.

(ix) The use of multiple pupil algorithms makes the reported metrology metric less sensitive to sampling and gives an estimate of this robustness.

(x) The use of multiple pupil algorithms instead of reference metrology to estimate the accuracy of single setup measurements.

Aspects of the present invention are described above with reference to flowchart illustrations and/or portion diagrams of methods, apparatus (systems) and computer program products according to embodiments of the invention. It will be understood that each portion of the flowchart illustrations and/or portion diagrams, and combinations of portions in the flowchart illustrations and/or portion diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or portion diagram or portions thereof.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or portion diagram or portions thereof.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or portion diagram or portions thereof.

The aforementioned flowchart and diagrams illustrate the architecture, functionality, and operation of possible implementations of systems, methods and computer program products according to various embodiments of the present invention. In this regard, each portion in the flowchart or portion diagrams may represent a module, segment, or portion of code, which comprises one or more executable instructions for implementing the specified logical function (s). It should also be noted that, in some alternative implementations, the functions noted in the portion may occur out of the order noted in the figures. For example, two portions shown in succession may, in fact, be executed substantially concurrently, or the portions may sometimes be executed in the reverse order, depending upon the functionality involved. It will also be noted that each portion of the portion diagrams and/or flowchart illustration, and combinations of portions in the portion diagrams and/or flowchart illustration, can be implemented by special purpose hardware-based systems that perform the specified functions or acts, or combinations of special purpose hardware and computer instructions.

In the above description, an embodiment is an example or implementation of the invention. The various appearances of "one embodiment", "an embodiment", "certain embodiments" or "some embodiments" do not necessarily all refer to the same embodiments. Although various features of the invention may be described in the context of a single embodiment, the features may also be provided separately or in any suitable combination. Conversely, although the invention may be described herein in the context of separate embodiments for clarity, the invention may also be implemented in a single embodiment. Certain embodiments of the invention may include features from different embodiments disclosed above, and certain embodiments may incorporate elements from other embodiments disclosed above. The disclosure of elements of the invention in the context of a specific embodiment is not to be taken as limiting their use in the specific embodiment alone. Furthermore, it is to be understood that the invention can be carried out or practiced in various ways and that the invention can be implemented in certain embodiments other than the ones outlined in the description above.

The invention is not limited to those diagrams or to the corresponding descriptions. For example, flow need not move through each illustrated box or state, or in exactly the same order as illustrated and described. Meanings of technical and scientific terms used herein are to be commonly understood as by one of ordinary skill in the art to which the invention belongs, unless otherwise defined. While the invention has been described with respect to a limited number of embodiments, these should not be construed as limitations on the scope of the invention, but rather as exemplifications of some of the preferred embodiments. Other possible variations, modifications, and applications are also within the scope of the invention. Accordingly, the scope of the invention should not be limited by what has thus far been described, but by the appended claims and their legal equivalents.

What is claimed is:

1. An apparatus comprising:
   an optical metrology tool that includes:
   an optical illumination source;
   optical elements;
   a processing unit configured to:
      select a plurality of measurement setups for a corresponding plurality of wafer regions, wherein the wafer regions are pre-determined or determined on-the-fly;
      send instructions to carry out metrology measurements with one of the selected measurement setups for each corresponding wafer region using the optical metrology tool, wherein the metrology measurements are on a plurality of metrology targets on one or more wafers;
      symmetrize pixel values in pupil images of the wafer regions;
      modify at least one pixel value according to an average of neighboring pixel values thereby reducing noise in the pupil images;
      concatenate pixels from the metrology measurements using a different one of the measurement setups;
      determine metrology metric values from the concatenated pixels;
      weight the concatenated pixels; and
      determine measurement stability by comparing results from concatenations of different sub-sets of the metrology measurements.

2. The apparatus of claim 1, wherein the processing unit is further configured to optimize a weighting function for the concatenated pixels using the processing unit to minimize pupil variation.

3. The apparatus of claim 1, wherein the symmetrizing is configured to produce pupil-derived metrics that characterize asymmetry in a perpendicular direction of a structure target that is measured.

4. The apparatus of claim 1, wherein the processing unit is further configured to:
- determine a difference between values of metrology metrics derived from different metrology algorithms; and
- report the difference if the difference exceeds a calculated difference threshold.

5. A method comprising:
- selecting, using a processing unit, a plurality of measurement setups for a corresponding plurality of wafer regions, wherein the wafer regions are pre-determined or determined on-the-fly;
- carrying out metrology measurements with one of the selected measurement setups for each corresponding wafer region using an optical metrology tool that includes the processing unit, an optical illumination source, and optical elements, wherein the metrology measurements are on a plurality of metrology targets on one or more wafers;
- symmetrizing pixel values in pupil images of the wafer regions using the processing unit;
- modifying at least one pixel value according to an average of neighboring pixel values using the processing unit thereby reducing noise in the pupil images;
- concatenating pixels from the metrology measurements using different of the measurement setups using the processing unit;
- determining metrology metric values from the concatenated pixels using the processing unit; and
- weighting the concatenated pixels using the processing unit; and
- determining measurement stability using the processing unit by comparing results from concatenations of different sub-sets of the metrology measurements.

6. The method of claim 5, further comprising optimizing, using the processing unit, a weighting function for the concatenated pixels to minimize pupil variation.

7. The method of claim 5, wherein the symmetrizing is configured to produce pupil-derived metrics that characterize asymmetry in a perpendicular direction of a structure target that is measured.

8. The method of claim 5, further comprising: determining a difference between values of metrology metrics derived from different metrology algorithms using the processing unit; and reporting, using the processing unit, the difference if the difference exceeds a calculated difference threshold.

9. A computer program product comprising a non-transitory computer readable storage medium having computer readable program embodied therewith, the computer readable program configured to carry out the method of claim 5.

* * * * *